(12) United States Patent
Yamazaki et al.

(10) Patent No.: US 6,979,605 B2
(45) Date of Patent: Dec. 27, 2005

(54) MANUFACTURING METHOD FOR A SEMICONDUCTOR DEVICE USING A MARKER ON AN AMORPHOUS SEMICONDUCTOR FILM TO SELECTIVELY CRYSTALLIZE A REGION WITH A LASER LIGHT

(75) Inventors: Shunpei Yamazaki, Atsugi (JP); Akihisa Shimomura, Atsugi (JP); Hisashi Ohtani, Atsugi (JP); Masaaki Hiroki, Atsugi (JP); Koichiro Tanaka, Atsugi (JP); Aiko Shiga, Atsugi (JP); Mai Akiba, Atsugi (JP); Kenji Kasahara, Tsukuba (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 155 days.

(21) Appl. No.: 10/306,345

(22) Filed: Nov. 29, 2002

(65) Prior Publication Data

US 2003/0235971 A1 Dec. 25, 2003

(30) Foreign Application Priority Data

Nov. 30, 2001 (JP) ........................................ 2001-367612

(51) Int. Cl.[7] .............................................. H01L 21/84
(52) U.S. Cl. ...................................... 438/166; 438/487
(58) Field of Search ................................ 438/149, 160, 438/166, 487, 975; 257/797

(56) References Cited

U.S. PATENT DOCUMENTS

| | | |
|---|---|---|
| 4,177,372 A | 12/1979 | Kotera et al. |
| 4,316,074 A | 2/1982 | Daly |
| 4,330,363 A | 5/1982 | Biegesen et al. |
| 4,370,175 A | 1/1983 | Levatter |
| 4,406,709 A | 9/1983 | Celler et al. |
| 4,554,823 A | 11/1985 | Lilley |
| 4,566,043 A | 1/1986 | Tamura |
| 4,592,799 A | 6/1986 | Hayafuji |

(Continued)

FOREIGN PATENT DOCUMENTS

| | | |
|---|---|---|
| EP | 0 488 801 | 6/1992 |
| EP | 0 646 950 | 4/1995 |

(Continued)

OTHER PUBLICATIONS

Hara et al., *Ultra–High Performance Poly–Si TFTs on a Glass by a Stable Scanning CW Laser Lateral Crystallization*, AM–LCD '01, pp. 227–230.

(Continued)

*Primary Examiner*—Stephen W. Smoot
(74) *Attorney, Agent, or Firm*—Eric J. Robinson; Robinson Intellectual Property Law Office, P.C.

(57) ABSTRACT

Position control of a crystal grain in accordance with an arrangement of a TFT is achieved, and at the same time, a processing speed during a crystallization process is increased. More specifically, there is provided a manufacturing method for a semiconductor device, in which crystal having a large grain size can be continuously formed through super lateral growth that is artificially controlled and substrate processing efficiency during a laser crystallization process can be increased. In the manufacturing method for a semiconductor device, instead of performing laser irradiation on an entire semiconductor film within a substrate surface, a marker as a reference for positioning is formed so as to crystallize at least an indispensable portion at minimum. Thus, a time period required for laser crystallization can be reduced to make it possible to increase a processing speed for a substrate. The above structure is applied to a conventional SLS method, so that it is possible to solve a problem inherent to the conventional SLS method, in that the substrate processing efficiency is poor.

30 Claims, 13 Drawing Sheets

U.S. PATENT DOCUMENTS

| | | |
|---|---|---|
| 4,668,089 A | 5/1987 | Oshida et al. |
| 4,692,191 A | 9/1987 | Maeda et al. |
| 4,861,964 A | 8/1989 | Sinohara |
| 4,978,970 A | 12/1990 | Okazaki |
| RE33,947 E | 6/1992 | Shinohara |
| 5,147,826 A | 9/1992 | Liu et al. |
| 5,214,001 A | 5/1993 | Ipposhi et al. |
| 5,225,886 A | 7/1993 | Koizumi et al. |
| 5,246,870 A | 9/1993 | Merchant |
| 5,275,851 A | 1/1994 | Fonash et al. |
| 5,294,555 A | 3/1994 | Mano et al. |
| 5,306,584 A | 4/1994 | Palmer |
| 5,315,101 A | 5/1994 | Hughes et al. |
| 5,365,875 A | 11/1994 | Asai et al. |
| 5,367,392 A | 11/1994 | Janai |
| 5,403,772 A | 4/1995 | Zhang et al. |
| 5,409,867 A | 4/1995 | Asano |
| 5,466,958 A | 11/1995 | Kakumu |
| 5,488,000 A | 1/1996 | Zhang et al. |
| 5,488,005 A | 1/1996 | Han et al. |
| 5,517,312 A | 5/1996 | Finarov |
| 5,521,107 A | 5/1996 | Yamazaki et al. |
| 5,528,056 A | 6/1996 | Shimada et al. |
| 5,529,937 A | 6/1996 | Zhang et al. |
| 5,543,636 A | 8/1996 | Yamazaki |
| 5,563,427 A | 10/1996 | Yudasaka et al. |
| 5,569,610 A | 10/1996 | Zhang et al. |
| 5,580,801 A | 12/1996 | Ino et al. |
| 5,591,668 A | 1/1997 | Maegawa et al. |
| 5,592,318 A | 1/1997 | Majima et al. |
| 5,604,360 A | 2/1997 | Zhang et al. |
| 5,608,232 A | 3/1997 | Yamazaki et al. |
| 5,618,741 A | 4/1997 | Young et al. |
| 5,620,906 A | 4/1997 | Yamaguchi et al. |
| 5,625,473 A | 4/1997 | Kondo et al. |
| 5,643,826 A | 7/1997 | Ohtani et al. |
| 5,656,825 A | 8/1997 | Kusumoto et al. |
| 5,679,588 A | 10/1997 | Choi et al. |
| 5,696,003 A | 12/1997 | Makita et al. |
| 5,698,882 A | 12/1997 | Park |
| 5,708,252 A | 1/1998 | Shinohara et al. |
| 5,712,191 A | 1/1998 | Nakajima et al. |
| 5,736,751 A | 4/1998 | Mano et al. |
| 5,761,381 A | 6/1998 | Arci et al. |
| 5,795,816 A | 8/1998 | Teramoto et al. |
| 5,803,965 A | 9/1998 | Yoon |
| 5,804,471 A | 9/1998 | Yamazaki et al. |
| 5,815,494 A | 9/1998 | Yamazaki et al. |
| 5,821,137 A | 10/1998 | Wakai et al. |
| 5,851,862 A | 12/1998 | Ohtani et al. |
| 5,854,803 A | 12/1998 | Yamazaki et al. |
| 5,886,320 A | 3/1999 | Gallo et al. |
| 5,886,366 A | 3/1999 | Yamazaki et al. |
| 5,891,764 A | 4/1999 | Ishihara et al. |
| 5,923,962 A | 7/1999 | Ohtani et al. |
| 5,937,282 A | 8/1999 | Nakajima et al. |
| 5,940,690 A | 8/1999 | Kusumoto et al. |
| 5,943,593 A * | 8/1999 | Noguchi et al. ............ 438/487 |
| 5,953,597 A | 9/1999 | Kusumoto et al. |
| 5,980,088 A | 11/1999 | Iwasaki et al. |
| 5,986,306 A | 11/1999 | Nakajima et al. |
| 6,043,453 A | 3/2000 | Arai |
| 6,059,873 A | 5/2000 | Yamaguchi et al. |
| 6,071,765 A | 6/2000 | Noguchi et al. |
| 6,136,632 A | 10/2000 | Higashi |
| 6,149,988 A | 11/2000 | Shinohara et al. |
| 6,169,292 B1 | 1/2001 | Yamazaki et al. |
| 6,174,374 B1 | 1/2001 | Zhang et al. |
| 6,176,922 B1 | 1/2001 | Aklufi et al. |
| 6,204,099 B1 | 3/2001 | Kusumoto et al. |
| 6,210,996 B1 | 4/2001 | Yamazaki et al. |
| 6,221,701 B1 | 4/2001 | Yamazaki |
| 6,242,289 B1 | 6/2001 | Nakajima et al. |
| 6,256,849 B1 | 7/2001 | Kim |
| 6,261,856 B1 | 7/2001 | Shinohara et al. |
| 6,265,745 B1 | 7/2001 | Kusumoto et al. |
| 6,285,042 B1 | 9/2001 | Ohtani et al. |
| 6,322,625 B2 * | 11/2001 | Im ............................. 117/43 |
| 6,335,541 B1 | 1/2002 | Ohtani et al. |
| 6,337,232 B1 | 1/2002 | Kusumoto et al. |
| 6,363,296 B1 | 3/2002 | Schulze |
| 6,365,933 B1 | 4/2002 | Yamazaki et al. |
| 6,372,039 B1 | 4/2002 | Okumura et al. |
| 6,373,870 B1 | 4/2002 | Yamazaki et al. |
| 6,393,042 B1 | 5/2002 | Tanaka |
| 6,396,616 B1 | 5/2002 | Fitzer et al. |
| 6,437,284 B1 | 8/2002 | Okamoto et al. |
| 6,468,842 B2 | 10/2002 | Yamazaki et al. |
| 6,475,872 B1 * | 11/2002 | Jung .......................... 438/384 |
| 6,479,329 B2 | 11/2002 | Nakajima et al. |
| 6,489,188 B2 | 12/2002 | Jung |
| 6,521,492 B2 | 2/2003 | Miyasaka et al. |
| 6,558,991 B2 | 5/2003 | Yamazaki et al. |
| 6,573,163 B2 * | 6/2003 | Voutsas et al. ............. 438/487 |
| 6,573,919 B2 | 6/2003 | Benear et al. |
| 6,576,919 B1 | 6/2003 | Yoshida |
| 6,577,380 B1 | 6/2003 | Sposili et al. |
| 6,583,381 B1 | 6/2003 | Duignan |
| 6,590,230 B1 | 7/2003 | Yamazaki et al. |
| 6,590,698 B1 | 7/2003 | Ohtsuki et al. |
| 6,599,788 B1 | 7/2003 | Kawasaki et al. |
| 6,602,744 B1 | 8/2003 | Maekawa et al. |
| 6,642,091 B1 | 11/2003 | Tanabe |
| 6,657,154 B1 | 12/2003 | Tanabe et al. |
| 6,660,085 B2 | 12/2003 | Hara et al. |
| 6,662,063 B2 | 12/2003 | Hunter et al. |
| 6,698,944 B2 | 3/2004 | Fujita |
| 6,700,096 B2 | 3/2004 | Yamazaki et al. |
| 6,727,125 B2 * | 4/2004 | Adachi et al. .............. 438/166 |
| 6,759,628 B1 | 7/2004 | Ino et al. |
| 6,764,886 B2 | 7/2004 | Yamazaki et al. |
| 6,830,617 B1 | 12/2004 | Ohtani et al. |
| 6,863,733 B1 | 3/2005 | Tanabe |
| 2001/0000243 A1 | 4/2001 | Sugano et al. |
| 2001/0019861 A1 | 9/2001 | Yamazaki et al. |
| 2001/0038127 A1 | 11/2001 | Yamazaki et al. |
| 2001/0055830 A1 | 12/2001 | Yoshimoto |
| 2002/0045288 A1 | 4/2002 | Yamazaki et al. |
| 2002/0054231 A1 | 5/2002 | Masuyuki |
| 2002/0068391 A1 | 6/2002 | Jung |
| 2002/0094008 A1 | 7/2002 | Tanaka |
| 2002/0096680 A1 | 7/2002 | Sugano et al. |
| 2002/0100937 A1 | 8/2002 | Yamazaki et al. |
| 2002/0119609 A1 | 8/2002 | Hatano et al. |
| 2002/0145711 A1 | 10/2002 | Magone et al. |
| 2002/0146873 A1 | 10/2002 | Tanaka |
| 2003/0024905 A1 | 2/2003 | Tanaka |
| 2003/0047732 A1 | 3/2003 | Yamazaki et al. |
| 2003/0059990 A1 | 3/2003 | Yamazaki |
| 2003/0075733 A1 | 4/2003 | Yamazaki et al. |
| 2003/0089691 A1 | 5/2003 | Tanaka |
| 2003/0089907 A1 | 5/2003 | Yamaguchi et al. |
| 2003/0112322 A1 | 6/2003 | Tanaka |
| 2003/0136772 A1 | 7/2003 | Yamazaki et al. |
| 2003/0148594 A1 | 8/2003 | Yamazaki et al. |
| 2003/0153182 A1 | 8/2003 | Yamazaki et al. |
| 2003/0153999 A1 | 8/2003 | Miyanaga et al. |
| 2003/0171837 A1 * | 9/2003 | Yamazaki et al. .......... 700/121 |
| 2003/0211714 A1 | 11/2003 | Yamazaki et al. |
| 2003/0215973 A1 | 11/2003 | Yamazaki et al. |
| 2003/0228723 A1 | 12/2003 | Yamazaki et al. |

| | | | |
|---|---|---|---|
| 2003/0234395 A1 | 12/2003 | Kokubo et al. | |
| 2003/0235971 A1 | 12/2003 | Yamazaki et al. | |
| 2004/0040938 A1 | 3/2004 | Yamazaki et al. | |
| 2004/0053450 A1 * | 3/2004 | Sposili et al. | 438/151 |
| 2004/0053480 A1 | 3/2004 | Tanabe et al. | |
| 2004/0060515 A1 | 4/2004 | Tanabe et al. | |
| 2004/0132266 A1 | 7/2004 | Yamazaki et al. | |
| 2005/0009251 A1 | 1/2005 | Yamazaki et al. | |
| 2005/0037554 A1 | 2/2005 | Ohtani et al. | |

FOREIGN PATENT DOCUMENTS

| | | |
|---|---|---|
| EP | 1 049 144 | 11/2000 |
| GB | 2 354 111 | 3/2001 |
| JP | 59-165450 | 9/1984 |
| JP | 59-205761 | 11/1984 |
| JP | 60-245172 | 12/1985 |
| JP | 60-245173 | 12/1985 |
| JP | 60-245174 | 12/1985 |
| JP | 61-048976 | 3/1986 |
| JP | 61-071636 | 4/1986 |
| JP | 61-085868 | 5/1986 |
| JP | 61-251115 | 11/1986 |
| JP | 62-104117 | 5/1987 |
| JP | 63-142807 | 6/1988 |
| JP | 01-134345 | 5/1989 |
| JP | 01-154124 | 6/1989 |
| JP | 01-194351 | 8/1989 |
| JP | 02-140915 | 5/1990 |
| JP | 02-181419 | 7/1990 |
| JP | 04-170067 | 6/1992 |
| JP | 04-206970 | 7/1992 |
| JP | 04-282869 | 10/1992 |
| JP | 04-313272 | 11/1992 |
| JP | 05-067785 | 3/1993 |
| JP | 05-090589 | 4/1993 |
| JP | 05-206464 | 8/1993 |
| JP | 05-315278 | 11/1993 |
| JP | 06-163401 | 6/1994 |
| JP | 07-130652 | 5/1995 |
| JP | 07-183540 | 7/1995 |
| JP | 07-193247 | 7/1995 |
| JP | 07-326769 | 12/1995 |
| JP | 08-078329 | 3/1996 |
| JP | 08-195357 | 7/1996 |
| JP | 09-219380 | 8/1997 |
| JP | 09-253879 | 9/1997 |
| JP | 09-270393 | 10/1997 |
| JP | 09-289321 A | 11/1997 |
| JP | 10-135468 | 5/1998 |
| JP | 10-135469 | 5/1998 |
| JP | 11-354463 | 12/1999 |
| JP | 2001-102373 | 4/2001 |
| JP | 3221724 B2 | 10/2001 |
| JP | 2003-229432 | 8/2003 |

OTHER PUBLICATIONS

Takeuchi et al., *Performance of Poly–Si TFTs Fabricated by a Stable Scanning CW Laser Crystallization*, AM–LCD '01, pp. 251–254.

Official Action dated May 13, 2004 for U.S. Appl. No. 10/305,361.

James S. Im et al., On the Super Lateral Growth Phenomenon Observed in Excimer Laser–Induced Crystallization of Thin Si Films, Appl. Phys. Lett., 64(17), Apr. 25, 1994, pp. 2303–2305.

Robert S. Sposili et al., Sequential Lateral Solidification of Thin Silicon Films on $SiO_2$, Appl. Phys. Lett., 69(19), Nov. 4, 1996, pp. 2864–2866.

C. Hayzelden et al., *In situ Transmission Electron Microscopy Studies of Silicide–Mediated Crystallization of Amorphous Silicon*, Appl. Phys. Lett., vol. 60, No. 2, pp. 225–227, Jan. 13, 1992.

G. Liu et al., *Selective Area Crystallization of Amorphous Silicon Films by Low–Temperature Rapid Thermal Annealing*, Appl. Phys. Lett., vol. 55, No. 7, pp. 660–662, Aug. 14, 1989.

S. Caune et al., *Combined CW Laser and Furnace Annealing of Amorphous Si and Ge In Contact With Some Metal*, Applied Surface Science, pp. 597–604, Jan. 1, 1989.

F. Takeuchi et al., 1–7–3: *Performance of Poly–Si TFT Using The CW Laser Lateral Crystallization (CLC)*, IDMC 2002, pp. 73–76, Jan. 1, 2002.

J. Lee et al., *ECR Plasma Oxidation Effects on Performance and Stability of Polisilicon Thin Film Transistors*, IEDM 94, pp. 523–526, Jan. 1, 1994.

J. Lee et al., *High Performance Low Temperature Polysilicon Thin Film Transistor Using ECR Plasma Thermal Oxide as Gate Insulator*, IEEE Electron Device Letters, vol. 15, No. 8, pp. 301–303, Aug. 1, 1994.

T. Li et al., *On the Pseudo–Subtrheshold Characteristics of Polycrystalline–Silicon Thin–Film Transistors with Large Grain Size*, IEEE Electron Device Letters, vol. 14, No. 5, pp. 240–242, May 1, 1993.

P. Lin et al., *The Impact of Scaling–Down Oxide Thickness on Poly–Si Thin–Film Transistors' IV Characteristics*, IEEE Electron Device Letters, vol. 15, No. 4, pp. 138–139, Apr. 1, 1994.

R. Kakkad et al., *Crystallized Si Films By Low–Temperature Rapid Thermal Annealing of Amorphous Silicon*, J. Appl. Phys., pp. 2069–2072, vol. 65, No. 5, Mar. 1, 1989.

R. Kakkad et al., *Low Temperature Selective Crystallization of Amorphous Silicon*, Journal of Non–Crystalline Solids, pp. 66–68, Aug. 1, 1989.

A. Hara et al., *High –Performance Polycrystalline Silicon Thin Film Transistors on Non–Alkali Glass Produced Using Continuous Wave Laser Lateral Crystallization*, Jpn. J. Appl. Phys., vol. 41, Part 2, No. 3B, pp. L311–313, Mar. 15, 2002.

A. Dvurechenskii et al., *Transport Phenomena in Amorphous Silicon Doped by Ion Implantation of 3d Metals*, Phys. Stat. Sol., pp. 635–640, Jan. 1, 1986.

T. Hempel et al., *Needle–Like Crystallization of Ni Doped Amorphous Silicon Thin Films*, Solid State Communications, pp. 921–924, vol. 85, No. 11, Mar. 1, 1993.

G. Liu et al., *Polycrystalline Silicon Thin Film Transistors on Corning 7059 Glass Substrates Using Short Time, Low–Temperature Processing*, Appl. Phys. Lett., vol. 62, No. 20, pp. 2554–2556, May 17, 1993.

A. Hara et al., *High Performance Poly–Si TFTs on a Glass by a Stable Scanning CW Laser Lateral Crystallization*-IEDM–01, Technical Digest of International Electron Devices Meeting, Jan. 1, 2001, pp. 747–750.

Search Report of Sep. 6, 2004, for Singapore Application No. 200207340–1.

European Search Report of Feb. 21, 2005 for EP 0202682.9.

* cited by examiner

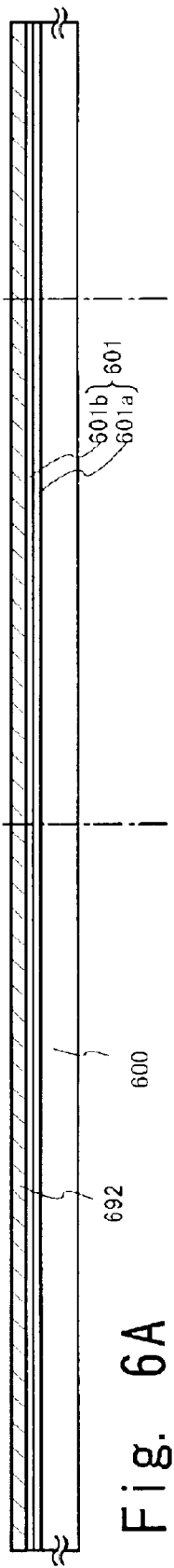
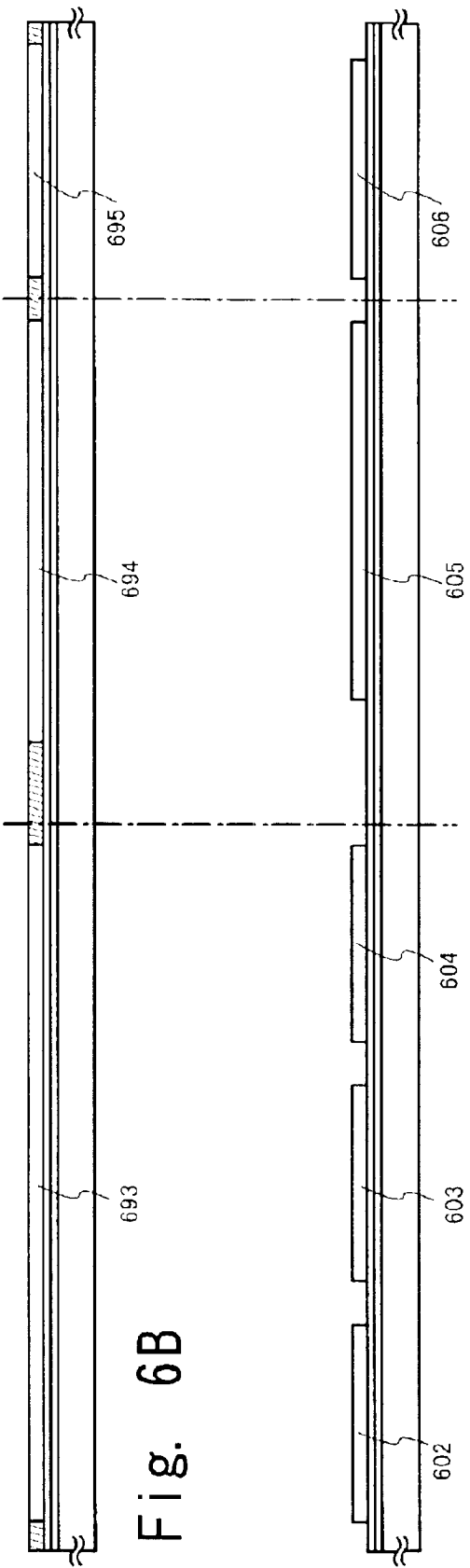
Fig. 6A
Fig. 6B
Fig. 6C

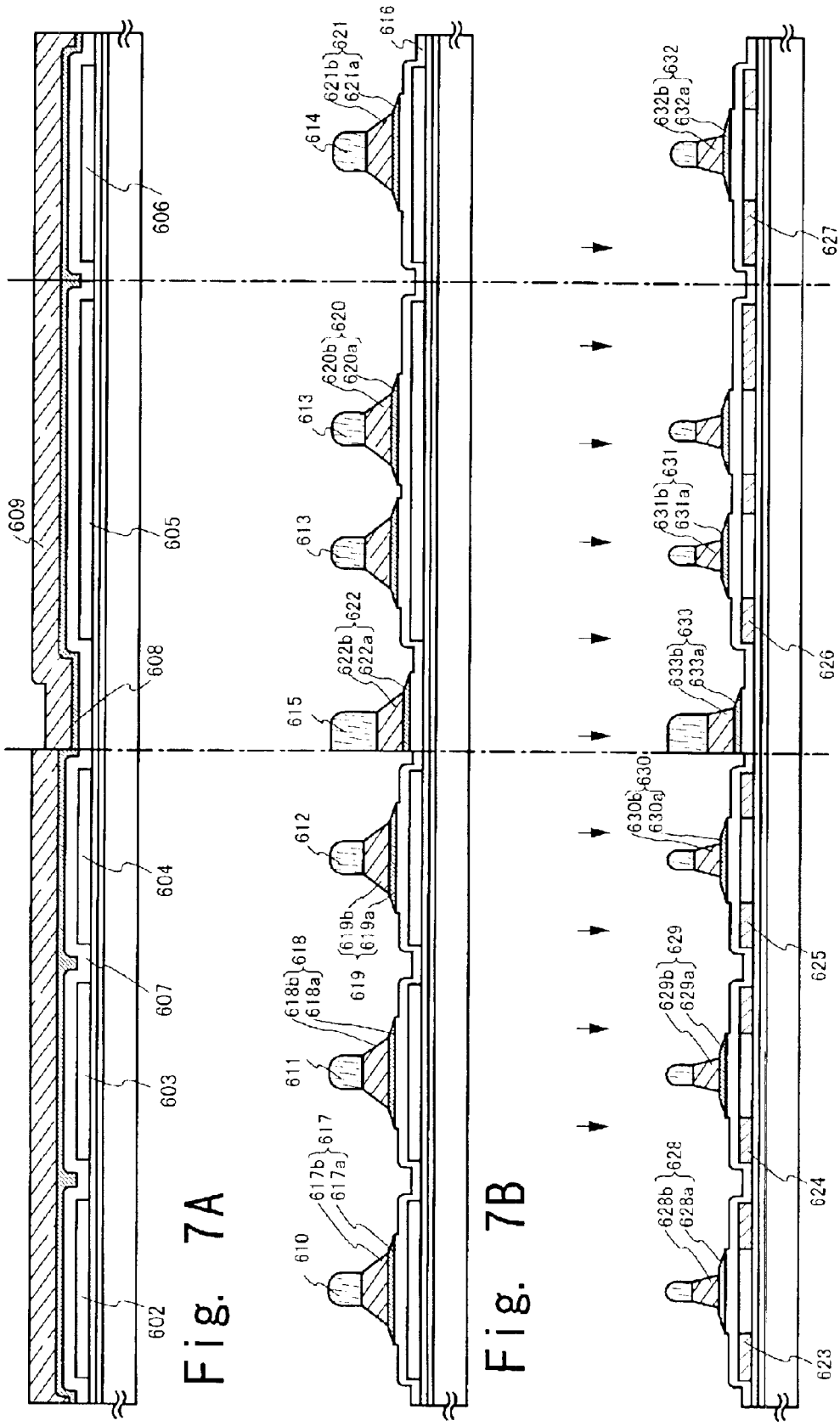

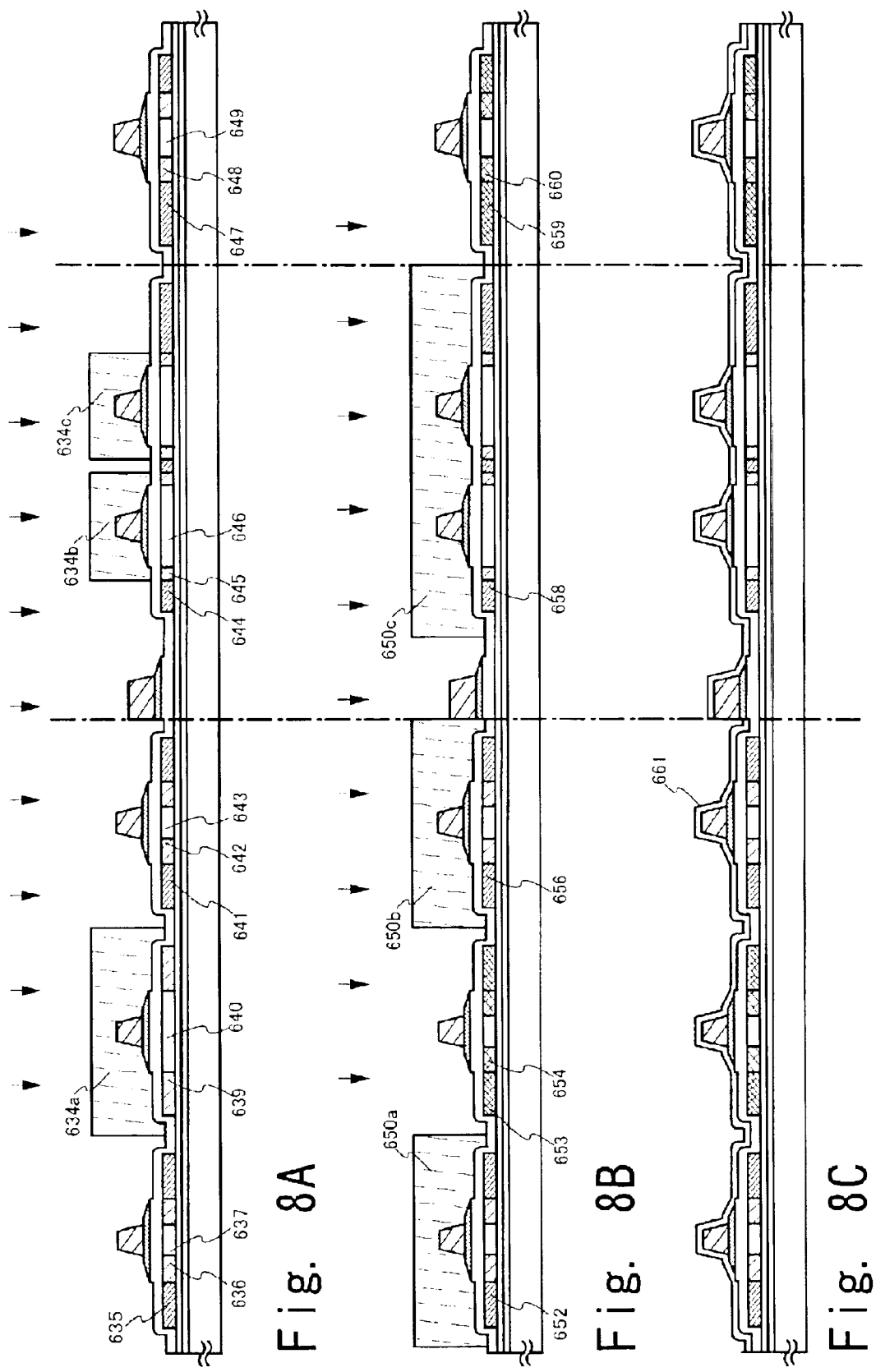

scan direction
of laser beam
←

←—— 3 μm ——→
feeding pitch

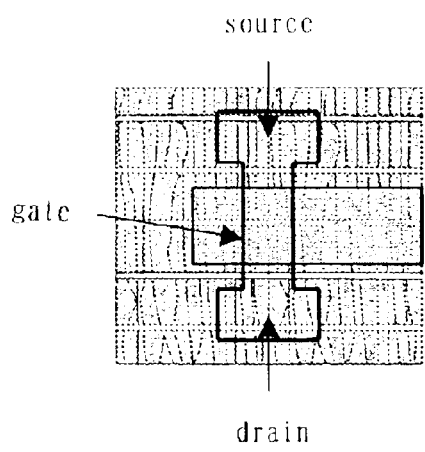
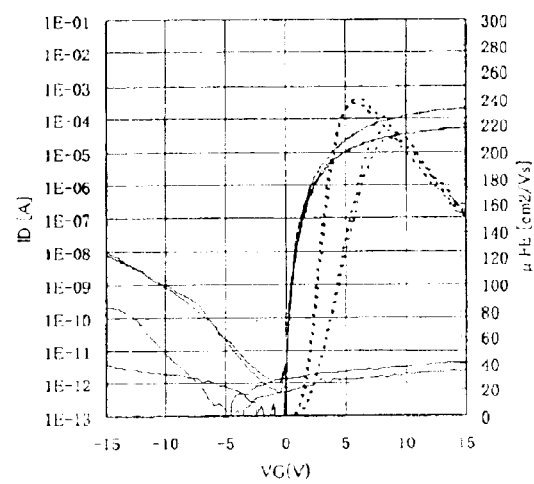
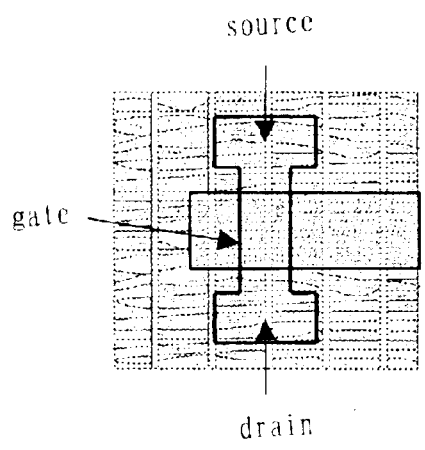
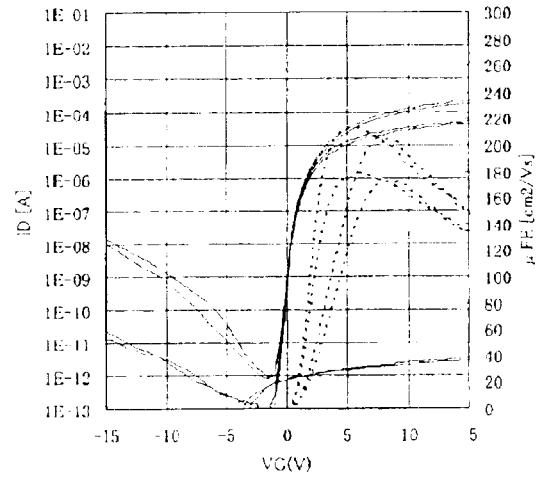
Fig. 13

MANUFACTURING METHOD FOR A SEMICONDUCTOR DEVICE USING A MARKER ON AN AMORPHOUS SEMICONDUCTOR FILM TO SELECTIVELY CRYSTALLIZE A REGION WITH A LASER LIGHT

BACKGROUND OF THE INVENTION

1. Field of the Invention

The present invention relates to a manufacturing method for a semiconductor device having a thin film transistor, and particularly to a technique of forming a crystalline semiconductor film used for forming an active layer of the thin film transistor.

2. Description of the Related Art

As an example of a method of forming the active layer of the thin film transistor (hereinafter, referred to as TFT), there has been developed a technique of forming an amorphous semiconductor film on a substrate having an insulating surface to crystallize the film through a laser annealing method, a thermal annealing method, or the like.

The laser annealing method is known as a crystallization technique which makes it possible to apply a high energy only to the amorphous semiconductor film to crystallize the film without significantly increasing a temperature of a glass substrate. In particular, an excimer laser oscillating a light with a short wavelength equal to or less than 400 nm is a typical laser which has been used since an initial stage of development of the laser annealing method. The laser annealing method is performed as follows: a laser beam is processed into a spot or a linear shape on an irradiated surface through an optical system and the processed laser light is scanned over the irradiated surface on the substrate (an irradiation position of the laser light is moved relative to the irradiated surface).

However, in the crystalline semiconductor film formed by the laser annealing method, a plurality of crystal grains aggregate to form the film (a grain size obtained by a conventional excimer laser crystallization method is generally about 0.1 to 0.5 $\mu$m) and the crystal grains are arranged randomly in terms of positions and sizes thereof.

The TFT manufactured on the glass substrate is formed while separating the crystalline semiconductor film into island-shaped patterns in order to separate elements. Thus, it is impossible to designate the position and the size of the crystal grain to form the TFT. Therefore, a channel formation region is hardly formed using a single crystalline semiconductor film without influence of a grain boundary.

An interface of the crystal grains (grain boundary) corresponds to a region where translational symmetry of the crystal is broken up. It is known that this reduces current transportation characteristics of carriers due to an influence of a potential barrier in a recombination center or a trapping center of the carriers or in the grain boundary, which is caused by a crystal defect or the like, and causes an OFF current to increase in the TFT.

Here, a technique called a super lateral growth is known, which can provide a large grain size as compared with the grain size in the conventional excimer laser crystallization method. This technique is described in detail by James S. Im and H. J. Kim in "On the super lateral growth phenomenon observed in excimer laser-induced crystallization of thin Si films, Appl. Phys. Lett. 64(17), 25 Apr. 1996, pp. 2303–2305".

According to the super lateral growth, the laser light is applied to form a portion where the semiconductor film is completely melted and a portion where a solid-phase semiconductor region remains, and a crystal growth is started with the solid-phase semiconductor region used as a crystal nucleus. It takes some time for the completely melted region to exhibit nucleation, so that until the nucleation is generated in the completely melted region, the crystal is grown in a horizontal direction (hereinafter, referred to as lateral direction) with respect to a film surface of the semiconductor film with the solid-phase semiconductor region used as a crystal nucleus. Thus, the crystal grain grows to such a degree as to make its length several tens of times the film thickness. For example, a lateral crystal growth occurs with a length of 1 $\mu$m to 2 $\mu$m with respect to a silicon film having a thickness of 60 nm. Hereinafter, this phenomenon is referred to as a super lateral growth.

In the case of the above super lateral growth, a relatively large crystal grain can be obtained, but an energy intensity in an energy intensity region of a laser light to realize by the super lateral growth is extremely high as compared with that used in the general excimer laser crystallization. Also, since a range of the energy intensity region is extremely narrow, from a viewpoint of position control of the crystal grain, it is impossible to control positions where the crystal grains having a large grain size are obtained. Further, regions other than the region having the crystal grains with a large grain size become microcrystalline regions where the nucleation occurs in numerous positions or amorphous regions. In the regions, crystal grains are nonuniform in size and surface roughness of the crystal is extremely large. Therefore, an irradiation condition generally used for manufacturing the semiconductor device is a condition such that a uniform grain size of about 0.1 $\mu$m to 0.5 $\mu$m is easily obtained.

In addition, as described by Robert S. Sposili and James S. Im in "Sequential lateral solidification of thin silicon films on SiO$_2$, Appl. Phys. Lett. 69(19), 4 Nov. 1996, pp. 2864–2866", James S. Im et al. disclose a sequential lateral solidification method (hereinafter, referred to as SLS method) which can realize the super lateral growth at an arbitrary place under an artificial control. This SLS method is a method in which an excimer laser light of pulse oscillation is applied onto a sample through a slit-like mask. In this method, the crystallization is performed such that a relative position of the sample and the laser light is shifted by a distance approximately corresponding to a crystal length (about 0.75 $\mu$m) obtained by the super lateral growth for each shot and thus, crystal is formed continuously by using the super lateral growth that is artificially controlled.

As described above, according to the SLS method, the crystal grains subjected to the super lateral growth can be formed at an arbitrary place while being artificially controlled. However, it involves the following problems.

First, as a first problem, there can be cited poor substrate processing efficiency (throughput). As described above, in the SLS method, crystallization proceeds by a distance of about 1 $\mu$m per laser light shot. Therefore, it is necessary to make a relative movement distance (feeding pitch) of a beam spot of the laser light on a sample substrate equal to or less than 1 $\mu$m. According to the condition used for the general laser crystallization using the excimer laser of pulse oscillation, the feeding pitch per laser light shot is several tens of $\mu$m or more. Needless to say, however, the crystal peculiar to the SLS method cannot be manufactured under the above condition. The SLS method employs an XeCl excimer laser of pulse oscillation whose maximum oscillation frequency is 300 Hz. This only allows a crystallized region to be formed in such a manner that crystallization proceeds by a distance of about 300 μm at maximum per second with respect to a scanning direction of the laser light. With a processing speed at the above level, when the substrate size is enlarged, for example, to 600 mm×720 mm, a large amount of processing time per substrate is required in the conventional SLS method.

The fact that a large amount of processing time per substrate is required does not lead to only a problem in terms of time or cost. In actuality, when the amorphous semiconductor film is crystallized, processing of the surface thereof is important. For example, as pretreatment, a natural oxide film is removed using diluted hydrofluoric acid or the like and then, laser irradiation is performed in some cases. In the substrate surface, the natural oxide film may be regrown in a region subjected to laser irradiation at the end as compared with a region subjected to laser irradiation at the beginning. In this case, amounts of carbon, oxygen, and nitride elements or amounts of contamination impurities such as boron may differ in the substrate surface, these elements being taken in a completed crystal. Further, this may finally cause a variation in characteristics of a transistor in the substrate surface.

As a second problem, there can be cited the optical system that tends to be complicated in the conventional SLS method. It is required to incorporate in the optical system a mask used for processing the laser light into a slit-like shape on the substrate surface. In general, a film thickness of active layer silicon used for a polycrystalline silicon thin film transistor is several tens of nm or more. When the excimer laser of pulse oscillation is employed, a laser energy density of at least 200 mJ/cm$^2$ (as a typical example, with respect to an amorphous silicon film having a thickness of 50 nm, about 400 mJ/cm$^2$ in the XeCl excimer laser with a pulse width of 30 nanoseconds) is required for the laser crystallization. In the SLS method, according to an optimum condition of the super lateral growth, a slightly higher energy density region than the above is necessary. It is difficult to manufacture a slit-like mask resistant to such a high laser energy density. In a case of a mask made of metal, when a pulse laser light having a high energy density is applied, the film is locally subjected to an abrupt increase or decrease of temperature. There is concerned, for example, that peeling of the film occurs or a minute pattern shape is broken through a long-term use (in a case of photolithography performing resist exposure, a hard mask material such as chromium is used, but it is used at a low energy density beyond comparison with the laser energy density required for the silicon crystallization, so that there arises no problem concerning peeling of the film, the broken minute pattern shape, or the like). As described above, the conventional SLS method involves the complicated optical system and a factor making device maintenance difficult to perform.

Further, in order to realize the super lateral growth, it is required to make a spatial beam intensity profile of the laser light steep (to eliminate as much as possible an attenuated region in a light intensity located between an irradiation region and a nonirradiation region of the laser light). In the conventional SLS method, it is conceivable that since steep temperature slope property necessary for the super lateral growth cannot be obtained only through a general optical system which is used when the excimer laser is oscillated, the slit-like mask is required to partially shield the laser light.

SUMMARY OF THE INVENTION

The present invention has been made in view the above and an object of the present invention is therefore to solve the above-mentioned problem and to achieve position control of a crystal grain in accordance with an arrangement of TFTs simultaneously with increase in a processing speed during a crystallization process. More specifically, an object of the present invention is to provide a manufacturing method for a semiconductor device, in which crystal having a large grain size can be continuously formed through super lateral growth that is artificially controlled and substrate processing efficiency during a laser crystallization process can be increased.

Further, another object of the present invention is to provide a manufacturing method for a semiconductor device, in which crystal having a large grain size can be continuously formed through super lateral growth that is artificially controlled and substrate processing efficiency during a laser crystallization process can be increased, and in addition, a simple laser irradiation method is adopted in which it is not required to incorporate in an optical system a mask used for processing a laser light into a slit-like shape on a substrate surface as in a conventional SLS method.

A laser irradiation apparatus applied to the present invention includes a first means for controlling an irradiation position of a laser light to an object to be processed, a second means (laser oscillation apparatus) for oscillating the laser light, a third means (optical system) for processing the laser light, and a fourth means for controlling the oscillation of the second means and for controlling the first means such that a beam spot of the laser light processed by the third means covers a position determined based on data on a photomask shape (pattern information).

As the first means for controlling the irradiation position of the laser light to the object to be processed, there are two methods: a method of driving a stage by a stage controller, i.e., a method of changing a position of the object to be processed (substrate) placed on the stage; and a method of moving the irradiation position of a laser light spot using a laser optical system while fixing a substrate position. The present invention may employ any one of the above two methods or employ both the methods in combination.

Note that, the position determined based on the data on a photomask shape (pattern information) corresponds to each of portions serving as a channel formation region, a source region, and a drain region of the transistor, which are obtained by patterning a semiconductor film after crystallization into island-shaped semiconductor layers through photolithography.

In the fourth means, based on the data on the photomask shape, portions remaining on the substrate as the island-shaped semiconductor layers after patterning a semiconductor film formed on an insulating surface are grasped.

Subsequently, in order that at least regions including the portions remaining as the island-shaped semiconductor layers can be crystallized, a scanning portion of a first laser light is determined, and the first means is controlled such that the beam spot covers the scanning portion to partially crystallize the semiconductor film.

As described above, according to the present invention, instead of performing irradiation with the laser light scanned over the entire semiconductor film within a substrate surface, the laser light is scanned so as to crystallize at least an indispensable portion at minimum. That is, it is possible to dispense with a time period for applying the laser light to the portions removed at the time of the formation of the island-shaped semiconductor layers through patterning after crystallizing the semiconductor film. Thus, a time period required for the laser crystallization can be shortened and in addition, the processing speed of the substrate can be increased. The above structure is applied to the conventional SLS method, which becomes a means for solving a problem inherent to the conventional SLS method, in that substrate processing efficiency (throughput) is poor.

Further, according to the present invention, in addition to the method capable of reducing a time period required for the laser crystallization and of increasing the processing speed of the substrate, there is provided a simple method in which it is not required to incorporate in an optical system a mask used for processing a laser light into a slit-like shape on a substrate surface as in the conventional SLS method.

In order to realize the super lateral growth, it is required to make a spatial beam intensity profile of the laser light steep (to eliminate as much as possible an attenuated region in a light intensity located between an irradiation region and a nonirradiation region of the laser light). In the conventional SLS method, it is conceivable that since steep temperature slope property necessary for the super lateral growth cannot be obtained only through a general optical system which is used when the excimer laser is oscillated, the slit-like mask is required to partially shield the laser light. An apparatus irradiating the laser light is the one irradiating a second harmonic (or a third harmonic or a fourth harmonic) of a solid laser oscillation apparatus of pulse oscillation. In the solid laser, a divergence angle of the laser light emitted is small as compared with the excimer laser, so that with this laser structure, it is possible to converge beam only through a cylindrical lens used as a general optical system lens so as to have a spatial beam intensity profile of the laser light, which is optimum to the super lateral growth.

In addition, in order to increase the substrate processing efficiency, it is desirable to adopt an repetition frequency and a feeding pitch, which are optimum to the SLS method. Conditions therefor will be described below. The feeding pitch indicates a movement distance of the substrate stage for each pulse of the laser light. In the SLS method, there is a limit to the super lateral growth distance for each shot and thus, the substrate processing efficiency cannot be increased only by increasing the feeding pitch. If the feeding pitch is increased, it is required to increase the repetition frequency of the laser light in accordance therewith. The XeCl excimer laser used in the conventional SLS method has the frequency of 300 Hz at maximum. On the other hand, in the solid laser oscillation apparatus of pulse oscillation according to the claims 3 and 11 of the present invention, the repetition frequency can be increased to several MHz at maximum. Accordingly, irradiation with a high repetition frequency is performed using the solid laser oscillation apparatus of pulse oscillation, so that a throughput can be significantly improved as compared with the conventional SLS method. An upper limit of the repetition frequency may be determined within a range in which an energy density necessary for the super lateral growth is secured for each shot of the laser light, which is determined according to a maximum output of the solid laser oscillation apparatus main body of pulse oscillation (this is because, if the other conditions are the same, the energy density for each shot of the laser light is decreased when the frequency is increased).

Further, in the solid laser oscillation apparatus, it is desirable to employ the solid laser oscillation apparatus using semiconductor laser excitation instead of using conventional flash lamp excitation because the laser light energy is largely improved in its stability.

With the above structures, a manufacturing method for a semiconductor device can be provided, in which crystal grains having a large grain size can be continuously formed through super lateral growth that is artificially controlled and substrate processing efficiency during a laser crystallization process can be increased, and in addition, a simple laser irradiation method is adopted in which it is not required to incorporate in an optical system a mask used for processing a laser light into a slit-like shape on a substrate surface as in a conventional SLS method.

Note that, in the present invention, the term semiconductor device collectively refers to devices in general, which can function by utilizing semiconductor characteristics (for example, electronic devices represented by a liquid crystal display panel and electric appliances incorporating the electronic devices as components therein).

BRIEF DESCRIPTION OF THE DRAWINGS

In the accompanying drawings:

FIGS. 6A to 6C show a manufacturing method for an active matrix substrate;

FIGS. 7A to 7C show the manufacturing method for the active matrix substrate;

FIGS. 8A to 8C show the manufacturing method for the active matrix substrate;

FIG. 13 shows TFT characteristics with respect to a laser scanning direction.

DETAILED DESCRIPTION OF THE PREFERRED EMBODIMENTS

Hereinafter, an embodiment mode of the present invention will be described in detail with reference to the drawings.

Figure 1:
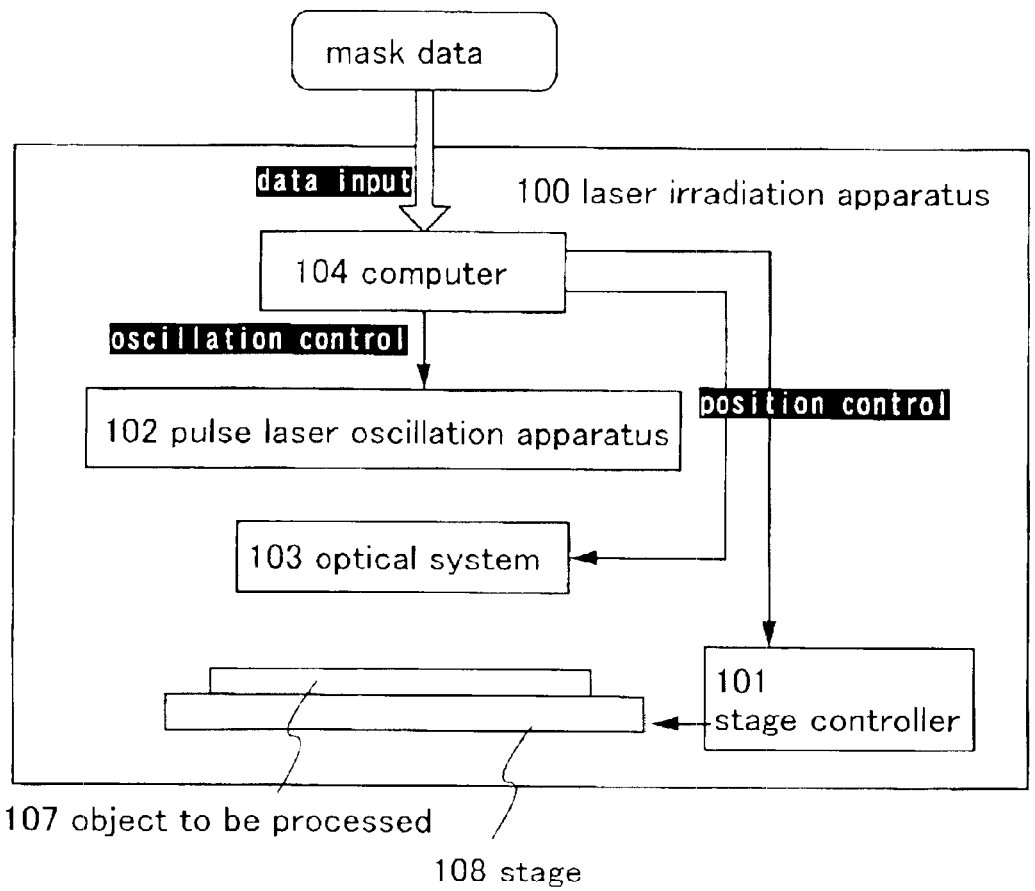
FIG. 1 shows a structure of a laser irradiation apparatus used in the present invention.

FIG. 1 is a block diagram showing a laser irradiation method of the present invention. As a first means for controlling an irradiation position of a pulse laser light with respect to an object to be processed 107, FIG. 1 shows two methods: a method of driving a stage 108 by a stage controller 101, i.e., a method of changing a position of the object to be processed 107 (substrate) placed on the stage and a method of moving the irradiation position of a laser light spot using an optical system 103 while fixing a substrate position. The present invention may employ any one of the above two methods or employ both the methods in combination.

The above two methods both involve a change of a relative position of the laser light spot with respect to the substrate, which is referred to as "scanning (of the laser light spot)" for the sake of convenience.

Also, a laser irradiation apparatus 100 includes a pulse laser oscillation apparatus 102 corresponding to a second means for oscillating a pulse laser light. The pulse laser oscillation apparatus 102 can be changed as appropriate according to a processing purpose. In the present invention, a well-known laser can be used. As a laser, a gas laser oscillation apparatus or a solid laser oscillation apparatus of pulse oscillation can be used. When the gas laser of pulse oscillation is used, the structures follow a general SLS method except that the position is controlled using a data pattern concerning a photomask shape through a computer 104. In this embodiment mode, a case where the solid laser oscillation apparatus of pulse oscillation is used will be described.

Examples of the solid laser of pulse oscillation include a YAG laser, a $YVO_4$ laser, a YLF laser, a $YAlO_3$ laser, a glass laser, an alexandrite laser, a sapphire laser, and a forsterite laser ($Mg_2SiO_4$), and in addition, a laser using as a laser medium crystal doped with $Cr^{3+}$, $Cr^{4+}$, $Nd^{3+}$, $Er^{3+}$, $Ce^{3+}$, $Co^{2+}$, $Ti^{3+}$, $Yb^{3+}$, or $V^{3+}$ as an impurity. A fundamental wave of the concerned laser varies depending on doped materials, but a laser light having the fundamental wave around 1 μm is obtained. A second harmonic, a third harmonic, and a fourth harmonic with respect to the fundamental wave can be obtained by using a nonlinear optical element.

Further, the laser irradiation apparatus 100 includes the optical system 103 corresponding to a third means which can process a beam spot of the laser light oscillated from the laser oscillation apparatus 102 on the object to be processed. A shape of the laser light emitted from the laser oscillation apparatus 102 becomes a circular shape when a rod shape is cylindrical or becomes a rectangular shape when the rod shape is slab. By further shaping the above laser light through the optical system, the beam spot of the laser light can be formed into a desired shape on a surface of the object to be processed 107.

In addition, the laser irradiation apparatus 100 includes the computer 104 corresponding to a fourth means. The computer 104 controls the oscillation of the laser oscillation apparatus 102 and also can control the stage controller 101 corresponding to the first means such that the beam spot of the laser light covers positions determined based on the data on mask pattern.

Note that, the laser irradiation method may be provided with a means for controlling a temperature of the object to be processed in addition to the above four means.

Figure 2A:
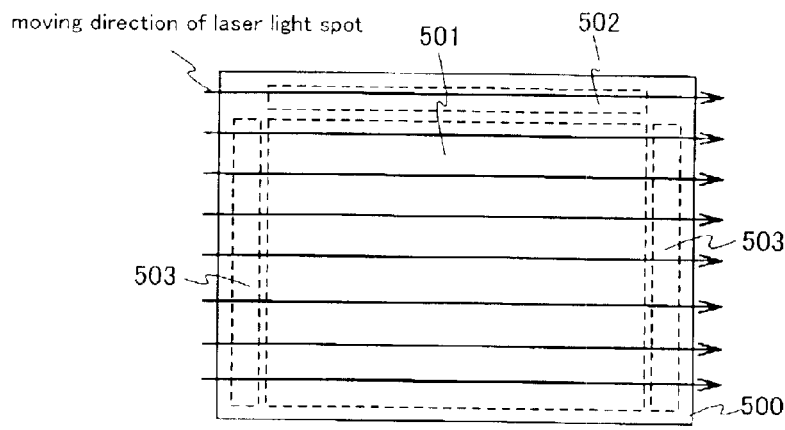
FIGS. 2A and 2B show a state in which a laser light spot is moved for each pulse with respect to an object to be processed.
Figure 2B:
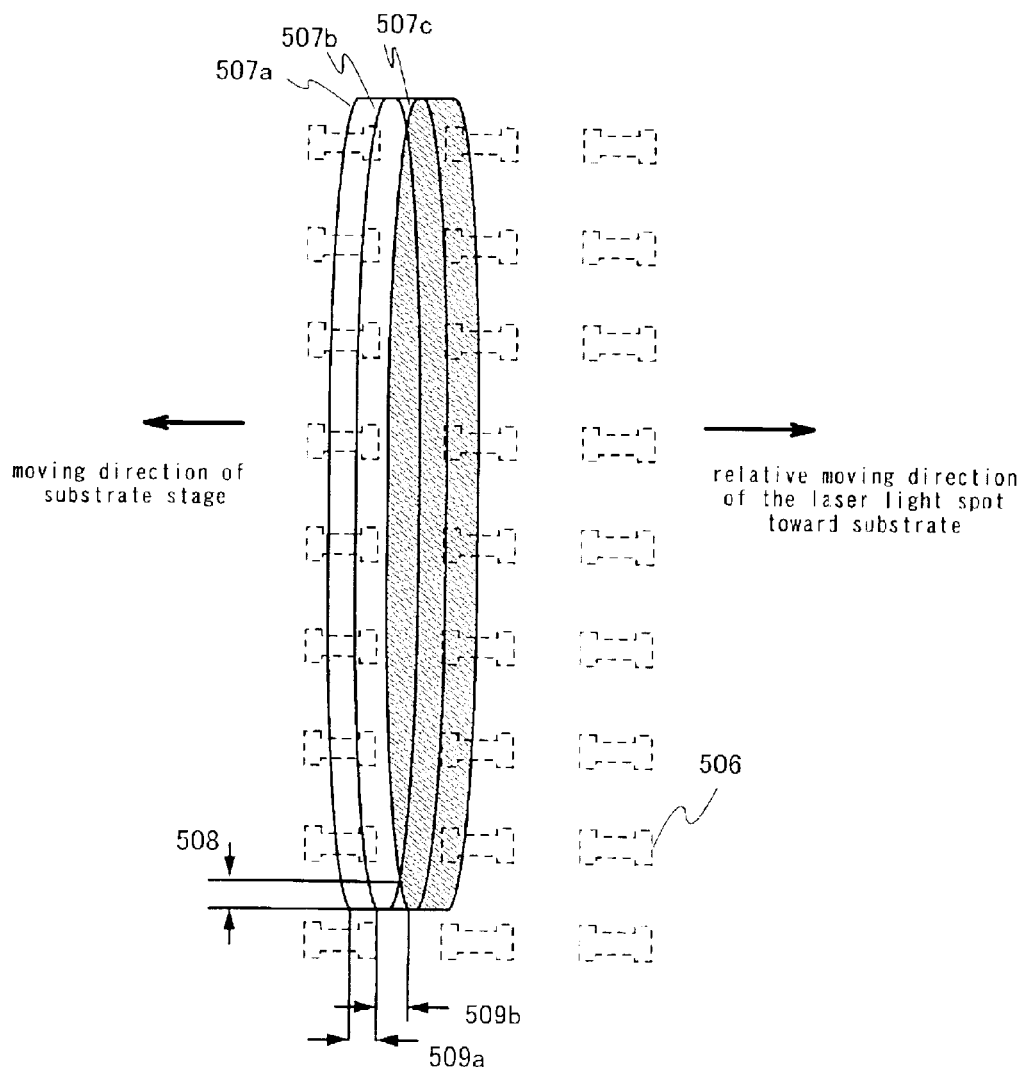

With reference to FIGS. 2A and 2B, a description will be given of a method of scanning a laser light on a semiconductor film 500 formed for manufacturing an active matrix semiconductor device. In FIG. 2A, portions shown by broken lines 501, 502, and 503 respectively correspond to those in which a pixel portion, a signal line driver circuit, and scanning line driver circuits are formed.

FIG. 2B shows a state in which a relative position of the substrate and the laser light spot is moved (scanned) for each laser light pulse and also shows beam spots 507a, 507b, and 507c in an enlarged view.

The beam spot 507a shown in FIG. 2B corresponds to a beam spot position of the laser light at a time of certain pulse irradiation, the beam spot 507b corresponds to that at a time of next pulse irradiation, and the beam spot 507c corresponds to that at a time of pulse irradiation after the next.

Also, indicated by 509a and 509b are distances at which the substrate stage moves for each pulse of the laser light (feeding pitch). This feeding pitch is required to be 0.3 μm or more and 5 μm or less, more preferably, 0.7 μm or more and 3 μm or less.

Further, the laser light is generally low in energy density at an edge portion of the beam spot as compared with the other portions, so that in some cases, processing may not be performed uniformly on the object to be processed. Therefore, it is desirable that the laser light irradiation is performed such that the edge portion in a longitudinal direction of the beam spot 507a of the laser light is not overlapped with portions 506 corresponding to island-shaped semiconductor films obtained by patterning the semiconductor film after crystallization. For example, when the linear beam spot is scanned, the irradiation is performed such that a region 508 shown in FIG. 2B is not overlapped with the portions 506 corresponding to the island-shaped semiconductor films.

Through the method shown in FIG. 2B, as shown in FIG. 2A, the laser light is scanned over portions where the pixel portion, the signal line driver circuit, and the scanning line driver circuits are formed.

Note that, in FIG. 2A, a scanning direction of the laser light is the same for the pixel portion 501, the signal line driver circuit 502, and the scanning line driver circuits 503. However, the present invention is not limited to this structure.

Figure 3:
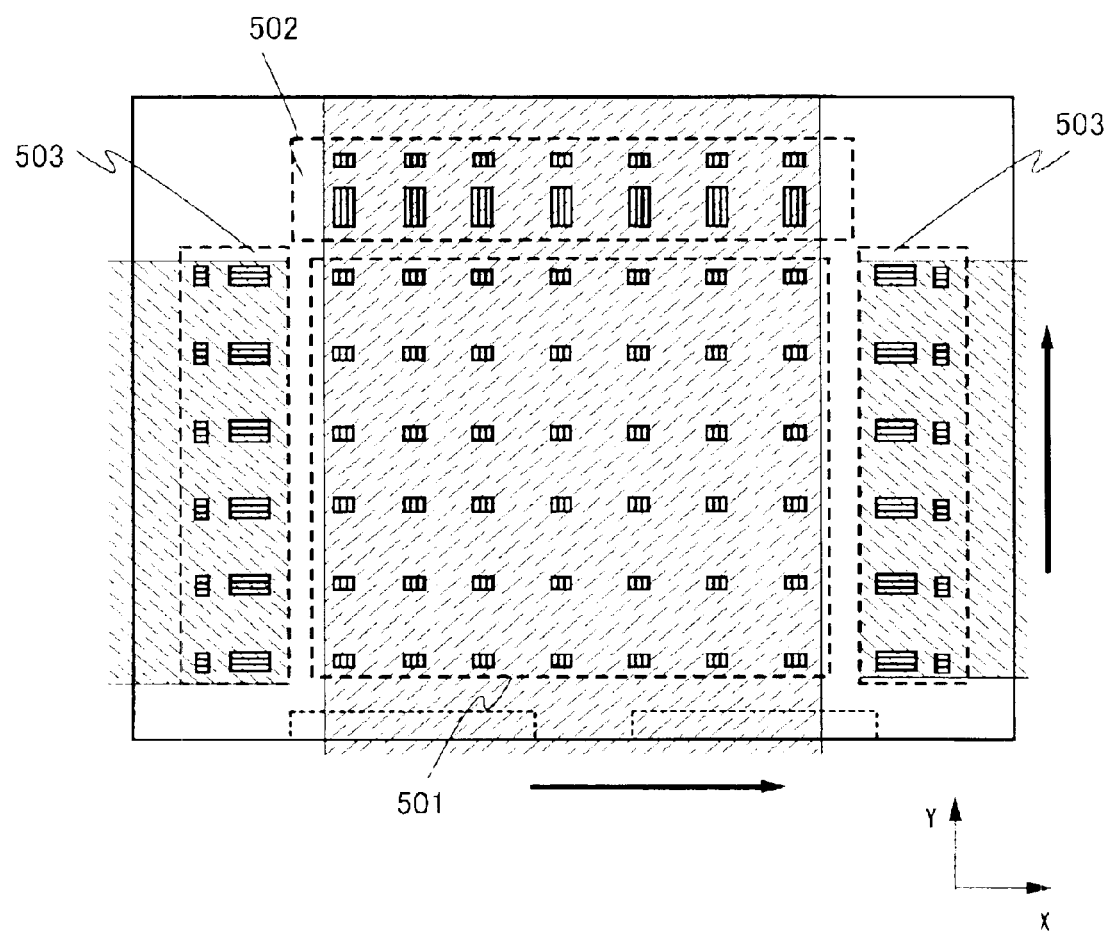
FIG. 3 shows a state in which laser light irradiation is performed while changing a direction of a relative movement of the laser light spot in a substrate.

FIG. 3 shows a case in which the scanning direction of the laser light for the scanning line driver circuit 503 regions is different from that for the other regions. In this case, in the scanning line driver circuits 503, the laser light is scanned in a Y direction, whereas the laser light is scanned over the pixel portion 501 and the signal line driver circuit 502 in an X direction orthogonal to the Y direction.

Further, when the semiconductor film after crystallization is used as an active layer of the TFT, it is desirable that the scanning direction therefor is determined so as to be parallel to the direction in which carriers in a channel formation region move. This will be explained with reference to FIGS. 4A and 4B.

Figure 4A:
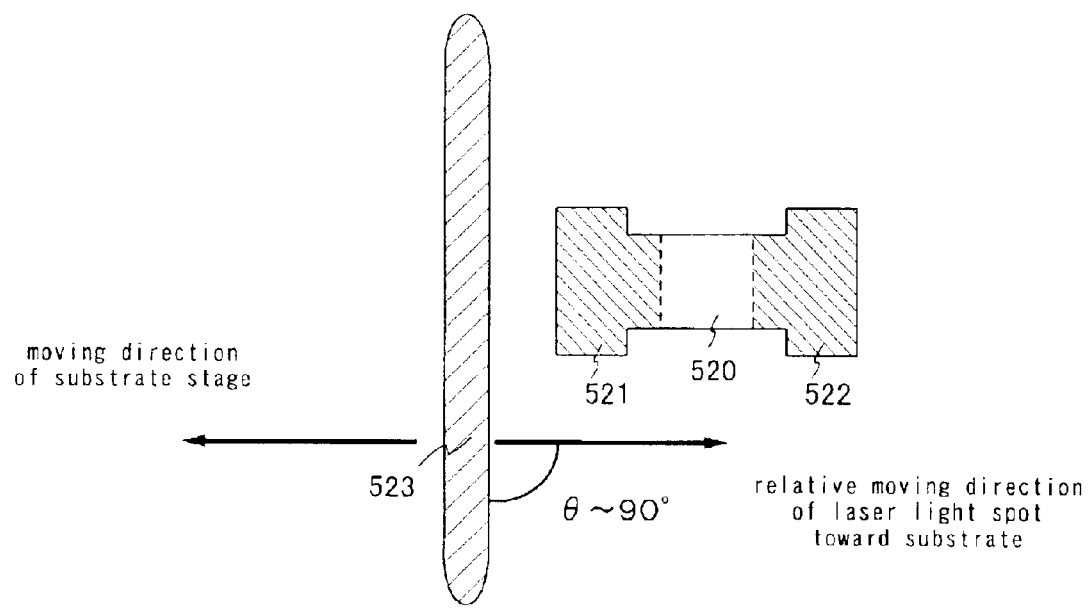
FIGS. 4A and 4B show a direction of a relative movement of the laser light spot with respect to an active layer of a TFT.

FIG. 4A shows an example of an active layer of a single-gate TFT having a single channel formation region, in which impurity regions 521, 522 serving as a source/drain region are formed so as to sandwich a channel formation region 520 therebetween. When the semiconductor film is crystallized using the laser oscillation apparatus of the present invention, the scanning direction of the laser light is determined so as to be parallel to the direction in which the carriers in the channel formation region move (channel length direction) as indicated by the arrow. Reference numeral 523 denotes a beam spot of the laser light that is scanned in a direction indicated by the arrow.

Figure 4B:
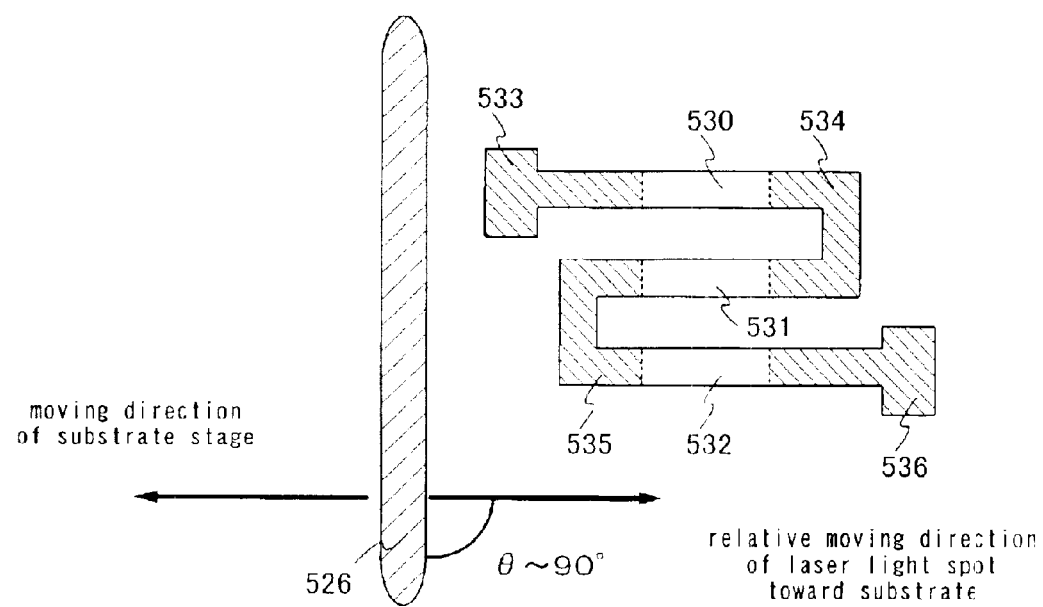

Also, FIG. 4B shows an example of an active layer of a triple-gate TFT having three channel formation regions, in which impurity regions 533, 534 are formed so as to sandwich a channel formation region 530 therebetween. Also, the impurity region 534 and an impurity region 535 are formed so as to sandwich a channel formation region 531 therebetween. Moreover, the impurity region 535 and an impurity region 536 are formed so as to sandwich a channel formation region 532 therebetween. When the semiconductor film is crystallized using the laser oscillation apparatus of the present invention, the laser light is scanned in a direction indicated by the arrow.

Figure 5A:
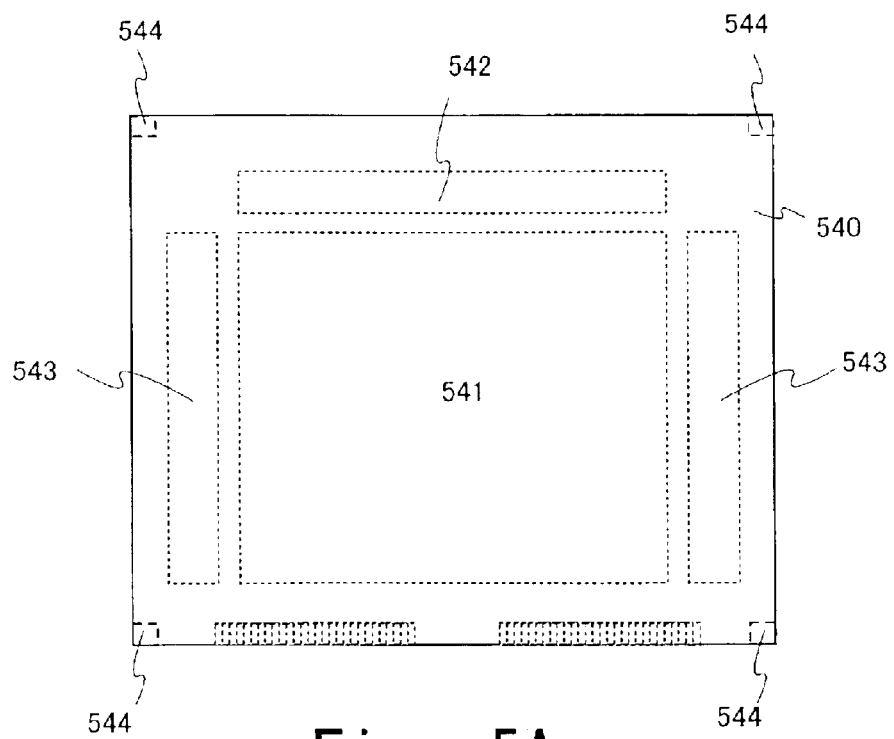
FIGS. 5A and 5B show marker formation positions.
Figure 5B:
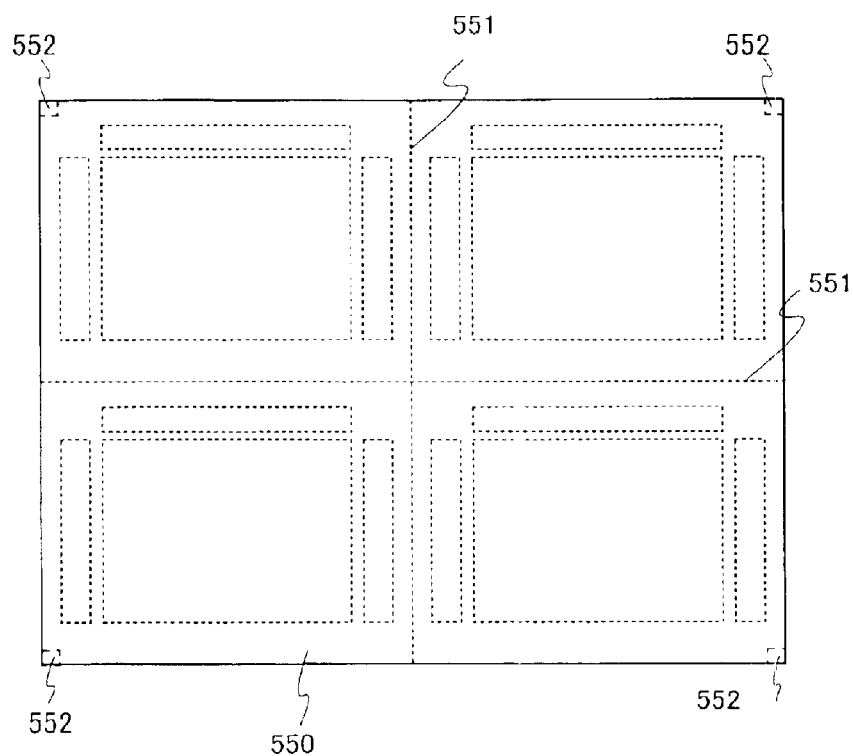

Note that, in order to determine the scanning portion of the laser light, it is required to form on the semiconductor film markers used for determining a position of the mask with respect to the semiconductor film. FIGS. 5A and 5B show positions at which the markers are formed on the semiconductor film formed to manufacture an active matrix semiconductor device. Note that, FIG. 5A shows a case in which one semiconductor device is formed from one substrate, whereas FIG. 5B shows a case where four semiconductor devices are formed from one substrate.

In FIG. 5A, reference numeral 540 denotes a semiconductor film formed on the substrate, and portions shown by broken lines 541, 542, and 543 respectively correspond to those in which a pixel portion, a signal line driver circuit, and scanning line driver circuits are formed. Reference numeral 544 denotes portions formed at four corners of the semiconductor film, in which markers are formed (marker formation portions).

Here, in FIG. 5A, the four marker formation portions 544 are formed at four corners, respectively, but the present invention is not limited to this structure. The positions and the number of marker formation portions are not limited to the above-mentioned form as long as the scanning portion of the laser light on the semiconductor film can be aligned in position with the mask for patterning the semiconductor film.

In FIG. 5B, denoted by 550 is a semiconductor film formed on the substrate and denoted by broken lines 551 are scribe lines used when the substrate is divided in a subsequent step. In FIG. 5B, the substrate is divided along the scribe lines 551 to thereby manufacture the four semiconductor devices. Note that, the number of semiconductor devices obtained through the division is not limited to this.

Reference numeral 552 denotes potions formed at four corners of the semiconductor film, in which the markers are formed (marker formation portions). Here, in FIG. 5B, the four marker formation portions 552 are formed at four corners, respectively, but the present invention is not limited to this structure. The positions and the number of marker formation portions are not limited to the above-mentioned form as long as the scanning portion of the laser light on the semiconductor film can be aligned in position with the mask for patterning the semiconductor film.

Note that, the formation of markers using the laser is the simplest method. As typical examples of the laser used when the marker is formed, there are a YAG laser, a $CO_2$ laser, and the like. Needless to say, however, the markers can be formed using the other lasers. The semiconductor film is irradiated with the above laser light through a metal mask or a glass mask processed into the marker shape in advance, so that the markers can be formed. In addition, the converged laser light with a spot size of 10 $\mu$m or less is irradiated while being scanned, so that the markers can be formed as well.

With the above-mentioned structures, it is possible to dispense with a time period for applying the laser light to the semiconductor film regions removed at a time of the formation of the island-shaped semiconductor films after crystallizing the semiconductor film. Thus, a time period required for the laser light irradiation can be shortened and in addition, the processing speed of the substrate can be increased.

Embodiment 1

In this embodiment, a description will be given of a manufacturing method for an active matrix substrate with reference to FIGS. 6A to 9. Here, a substrate on which a CMOS circuit, a driver circuit, and a pixel portion having a pixel TFT and a storage capacitor are all formed is called an active matrix substrate for the sake of convenience.

First, in this embodiment, a substrate 600 made of glass such as barium borosilicate glass or alumino borosilicate glass is used. Further, as the substrate 600, a quartz substrate or a silicon substrate, or a metal substrate or a stainless steel substrate whose surface is covered with an insulating film may be used. Alternatively, a plastic substrate having a heat resistance to a processing temperature of this embodiment may be used.

Subsequently, on the substrate 600, a base film 601 made of an insulating film such as a silicon oxide film, a silicon nitride film, or a silicon oxynitride film is formed using a known method (sputtering method, LPCVD method, plasma CVD method, or the like). In this embodiment, as the base film 601, a base film consisting of two layers, i.e., base films 601a and 601b is used. However, it is possible to employ a single-layer film or a structure in which two or more layers are laminated using the above insulating films (FIG. 6A).

Next, an amorphous semiconductor film 692 is formed with a thickness of 25 to 150 nm (preferably, 30 to 120 nm) on the base film 601 by a known method (sputtering method, LPCVD method, plasma CVD method, etc.) (FIG. 6A). Note that, in this embodiment, the amorphous semiconductor film is formed, but a microcrystalline semiconductor film or a crystalline semiconductor film may be formed. Also, a compound semiconductor film having an amorphous structure such as an amorphous silicon germanium film may be used.

Next, the amorphous semiconductor film 692 is crystallized through a laser crystallization method. The laser crystallization is performed using the laser irradiation method of the present invention. Specifically, according to information on masks inputted to the computer of the laser oscillation apparatus, only the amorphous semiconductor film in a designated region is selectively irradiated with the laser light. Needless to say, the laser crystallization may be performed by using the laser crystallization method in combination with the other known crystallization methods (thermal crystallization method using RTA or furnace annealing, thermal crystallization method using a metal element promoting crystallization, and the like).

According to the laser irradiation method of the present invention, a gas laser oscillation apparatus or a solid laser oscillation apparatus of pulse oscillation can be used among known laser light sources. When the gas laser of pulse oscillation is used, it is adapted only to control using a data pattern on a photomask shape through a computer, and the other structures follow a general SLS method. In this embodiment, a case where an Nd:YLF laser of pulse oscillation is used will be described.

Figure 10A:
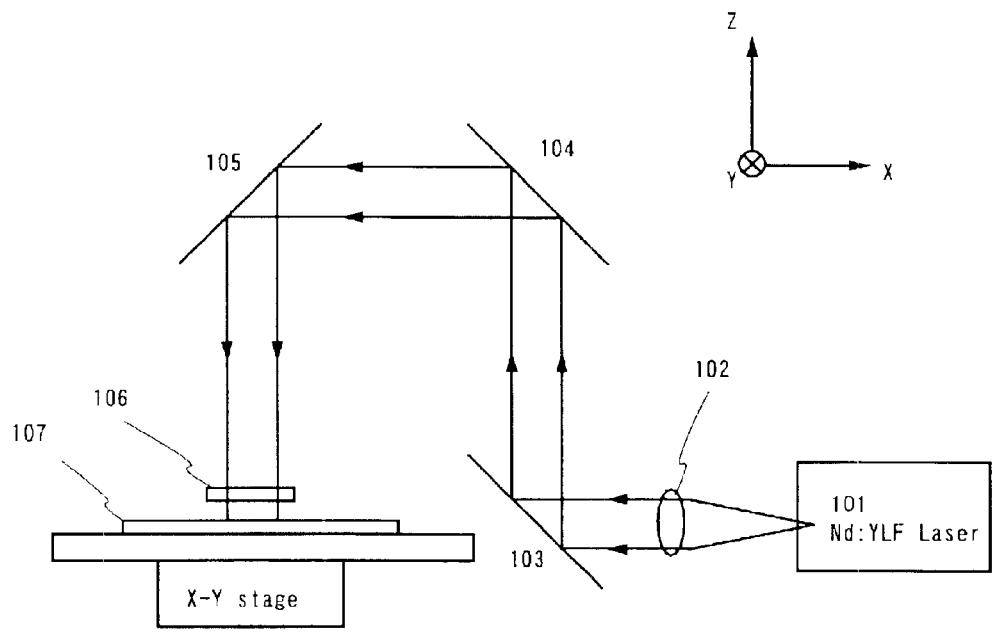
FIGS. 10A and 10B show a optical system of a laser irradiation apparatus in accordance with Embodiment 1 of the present invention.

FIG. 10A shows a laser crystallization processing apparatus. In FIG. 10A, there is shown a case by way of example, in which an Nd:YLF laser oscillation apparatus 101 is used under conditions that an output is 1.5 W and a repetition frequency is 1 kHz. A laser light source 101 employs a system in which YLF crystal and a nonlinear optical element are put in a resonator and a second harmonic having a wavelength of 527 nm is emitted. Needless to say, the nonlinear optical element may be placed outside the resonator. Further, the laser light source 101 is set such that a rod shape is cylindrical and a beam spot shape immediately after being emitted from the laser light source 101 is circular. However, even if the rod shape is supposedly slab and the beam spot shape immediately after being emitted is rectangular, the beam spot can be shaped into a desired form through the optical system as described below.

Figure 10B:
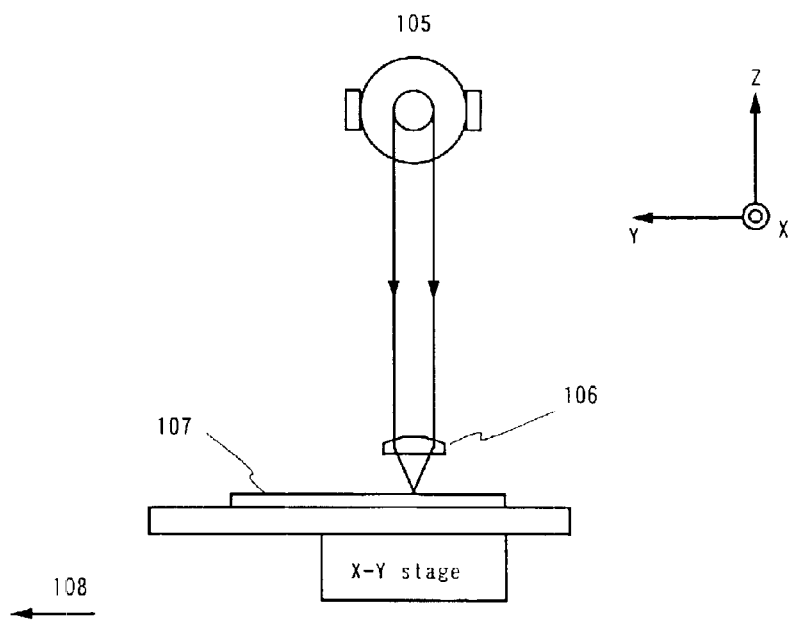

In this Nd:YLF laser, a beam diverging angle is 3 milliradians and a beam size is about 2 mm in diameter at a light emission port but it expands to about 1 cm in diameter at a position apart from the light emission port by 20 cm. When a single convex lens 102 having a focal length f=600 mm is placed at this position, the beam size becomes about 10 mm in diameter to obtain a parallel light. The laser light reflected by optical mirrors 103 to 105 of FIG. 10A is converged through a convex cylindrical lens 106 having a curvature in a Y direction of FIGS. 10A and 10B. In this case, the Y direction corresponds to a direction in which the beam spot of the laser light moves on the semiconductor film surface, that is, a widthwise direction of the beam spot. Also, an X direction of FIG. 10B corresponds to a longitudinal direction of the beam spot of the laser light on the semiconductor film surface, which is orthogonal to the movement direction of the beam spot of the laser light on the semiconductor film surface (the optical mirrors 103 to 105 are not provided because it is essentially needed but provided in terms of layout for the apparatus). With the above structures, a linear beam having a beam spot of 10 mm×10 $\mu$m on the semiconductor film surface as an irradiated surface is obtained.

Here, a method of shaping the laser beam into a laser light in the form of rectangle or ellipse, or a linear laser light on the irradiated surface is not limited to this. Although not shown, it is possible that a concave cylindrical lens is interposed between the optical mirror 103 and the convex cylindrical lens 106 to increase the beam spot in the longitudinal direction. Also, between the concave cylindrical lens and the laser light source 101, a beam collimator for changing the laser light into a parallel light or a beam expander for expanding the laser light can be interposed. Further, a method is shown here in which the laser light source having an output of 1.5 W is used to obtain the linear beam having a beam spot of 10 mm×10 $\mu$m, but in the case of using a laser light source with a higher output, it is desirable that the beam spot is increased only in a longitudinal direction without being increased in a widthwise direction (currently, an Nd:YLF laser oscillation apparatus using LD excitation usable with an output of 20 W is commercially available).

In order to move a relative position of the beam spot of the laser light on the semiconductor film surface, a substrate stage 101 is swept in the Y direction (widthwise direction of the beam spot). Assuming that the repetition frequency of the laser pulse is 1 kHz and a speed at which the substrate stage is swept is 3.0 mm/sec, the relative position of the substrate and the beam spot is shifted by 3 $\mu$m (feeding pitch: 3 $\mu$m) in the Y direction each time the laser pulse is irradiated once.

Figure 11A:
FIGS. 11A and 11B show a surface image observed by an SEM and a state of a grain boundary after laser crystallization, respectively.
Figure 11B:
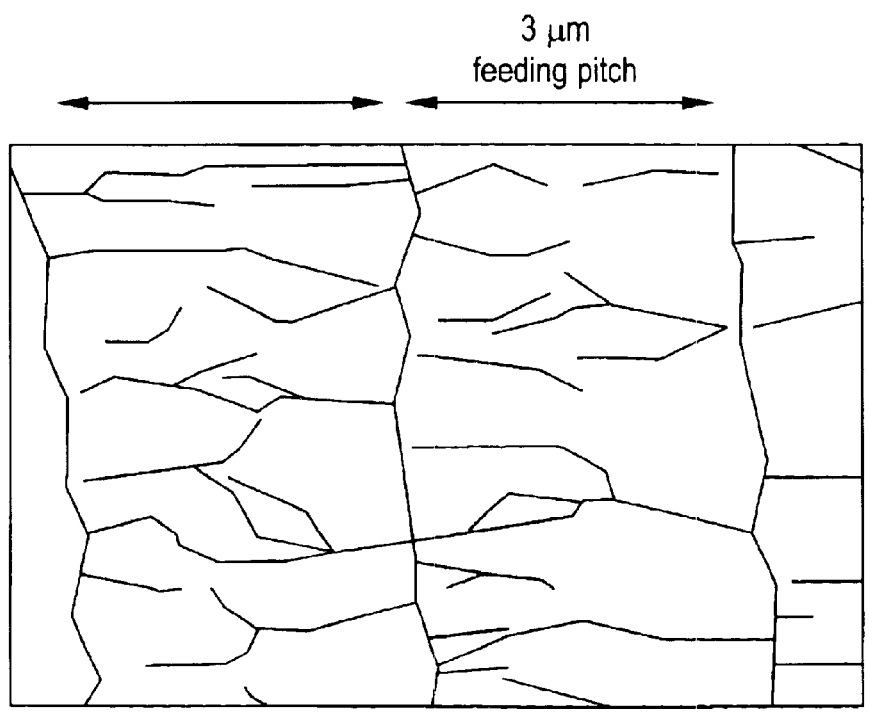

FIG. 11A shows an image observed by an SEM after a grain boundary is made apparent by performing secco etching on the silicon film crystallized by the laser irradiation method of this embodiment. FIG. 11B shows the size of crystal and the grain boundary of FIG. 11A in a clearly understandable manner. As apparent from FIGS. 11A and 11B, the crystal subjected to super lateral growth is continuously formed in the Y direction in which the beam spot of the laser light is scanned. Note that, the grain boundaries periodically appear in a direction perpendicular to the scanning direction of the laser beam spot, and the period just corresponds to 3 $\mu$m that is a feeding pitch obtained each time the laser pulse is irradiated once.

With the above-mentioned laser crystallization method, in the amorphous semiconductor film, regions 693, 694, and 695, in which the crystal grains having a large grain size by the artificially controlled super lateral growth are continuously formed, are formed (FIG. 6B).

Next, the semiconductor film is patterned into a desired shape and island-shaped semiconductor films 602 to 606 are formed from the crystallized regions 693, 694, and 695 (FIG. 6C).

After the island-shaped semiconductor films 602 to 606 are formed, a minute amount of an impurity element (boron or phosphorous) may be doped for controlling a threshold voltage of the TFT. Also, doping of impurity for controlling the threshold voltage may be performed before the laser crystallization or after formation of a gate insulating film.

Subsequently, a gate insulating film 607 covering the island-shaped semiconductor films 602 to 606 is formed. The gate insulating film 607 is formed of an insulating film containing silicon with a thickness of 40 to 150 nm by using the plasma CVD method or the sputtering method. In this embodiment, the gate insulating film 607 is formed of a silicon oxynitride film (composition ratio: Si=32%, O=59%, N=7%, and H=2%) with a thickness of 110 nm by using the plasma CVD method. Needless to say, the gate insulating film is not limited to the silicon oxynitride film, but may employ a single layer or a laminate structure using the other insulating films containing silicon.

Further, when the silicon oxide film is used, it can be formed by mixing TEOS (tetraethyl orthosilicate) and $O_2$, and performing discharge under the conditions of a reaction pressure of 40 Pa, a substrate temperature of 300 to 400° C., and a high-frequency (13.56 MHz) power density of 0.5 to 0.8 W/cm$^2$ by plasma CVD. The silicon oxide film thus produced can exhibit satisfactory characteristics as a gate insulating film by subsequent thermal annealing at 400 to 500° C.

Next, a first conductive film 608 having a film thickness of 20 to 100 nm and a second conductive film 609 having a film thickness of 100 to 400 nm are laminated on the gate insulating film 607. In this embodiment, the first conductive film 608 formed of a TaN film having a film thickness of 30 nm and the second conductive film 609 formed of a W film having a film thickness of 370 nm are laminated. The TaN film is formed by the sputtering method and at this time, sputtering is carried out in an atmosphere containing nitrogen using a Ta target. The W film is formed by the sputtering method using a W target. The W film also can be formed by the thermal CVD method using tungsten hexafluoride (WF$_6$). In any case, it is required to achieve a low resistance of the film used for the gate electrode and resistivity of the W film is desirably 20 $\mu\Omega$cm or less. The W film can obtain a low resistivity by increasing the grain size, but when the impurity elements such as oxygen are largely contained in the W film, the crystallization is inhibited to thereby make the film high in resistance. Accordingly, in this embodiment, the W film is formed while using the sputtering method using a high-purity W (purity: 99.9999%) target and further, sufficiently taking into account that an impurity is not mixed thereinto from vapor phase at the time of film formation. Thus, the W film with resistivity of 9 to 20 $\mu\Omega$cm can be achieved.

Note that, in this embodiment, although the first conductive film 608 and the second conducive film 609 are made of TaN and W, respectively, there is not imposed a particular limitation thereon. For both the films, an element selected from the group consisting of Ta, W, Ti, Mo, Al, Cu, Cr, and Nd, or an alloy material compound material mainly containing the above elements or may be used. Also, a semiconductor film doped with the impurity element such as phosphorous and represented by a polycrystalline silicon film may be used. In addition, an AgPdCu alloy may be used. Also, combinations may be employed including a combination of a first conductive film formed of a tantalum (Ta) film and a second conductive film formed of a W film, a combination of a first conductive film formed of a titanium nitride (TiN) film and a second conductive film formed of a W film, a combination of a first conductive film formed of a tantalum nitride (TaN) film and a second conductive film formed of a W film, a combination of a first conductive film formed of a tantalum nitride (TaN) film and a second conductive film formed of an Al film, and a combination of a first conductive film formed of a tantalum nitride (TaN) film and a second conductive film formed of a Cu film.

In addition, the structure is not limited to the two-layer structure but may employ a three-layer structure in which a tungsten film, an alloy (Al—Si) film of aluminum and silicon, and a titanium nitride film are laminated in the stated order. In this case, tungsten nitride may be used instead of the tungsten, an alloy (Al—Ti) film of aluminum and titanium may be used instead of the alloy (Al—Si) film of aluminum and silicon, or a titanium film may be used instead of the titanium nitride film.

Note that, it is important that an optimum etching method or a kind of etchant is appropriately selected according to the material for the conductive film.

Next, masks 610 to 615 made of resist are formed by using a photolithography method and a first etching process is performed so as to form electrodes and wirings. The first etching process is performed under first and second etching conditions (FIG. 7B). In this embodiment, the following conditions are employed as the first etching conditions. That is, an inductively coupled plasma (ICP) etching method is used, $CF_4$, $Cl_2$, and $O_2$ are used as etching gas, a flow rate among the respective gases is set to 25:25:10 (sccm), and an RF (13.56 MHz) power of 500 W is applied to coil type electrodes under a pressure of 1 Pa to produce plasma for etching. An RF (13.56 MHz) power of 150 W is also applied to the substrate side (sample stage) and thus a substantially negative self-bias voltage is applied thereto. The W film is etched under the first etching conditions and end portions of the first conductive layer are formed into a tapered shape.

Thereafter, without removing the masks 610 to 615 made of resist, the conditions are changed to the second etching conditions and etching is carried out for about 30 seconds under the following conditions as the second etching conditions. That is, $CF_4$ and $Cl_2$ are used as etching gas, a flow rate between the respective gases is set to 30:30 (sccm), and an RF (13.56 MHz) power of 500 W is applied to coil type electrodes under a pressure of 1 Pa to produce plasma. An RF (13.56 MHz) power of 20 W is also applied to the substrate side (sample stage) and thus a substantially negative self-bias voltage is applied thereto. Under the second etching conditions in which a mixture of $CF_4$ and $Cl_2$ is used, both the W and TaN films are etched to the same degree. Note that, in order to perform etching without remaining an unetched portion on the gate insulating film, an etching time may be increased at a rate of about 10 to 20%.

In the above-mentioned first etching process, the masks made of resist are formed into a suitable shape, which allows the end portions of the first and the second conductive layers to have a tapered shape due to an effect of the bias voltage applied to the substrate side. The taper angle of these tapered portions may be set to 15 to 45. Thus, conductive layers 617 to 622 having a first shape (including first conductive layers 617a to 622a and second conductive layers 617b to 622b) formed of the first and second conductive layers are formed by the first etching process. Denoted by 616 is a gate insulating film in which regions not covered with the conductive layers 617 to 622 having a first shape are etched by about 20 to 50 nm and thinned.

Next, a second etching process is performed without removing the masks made of resist (FIG. 7C). Here, $CF_4$, $Cl_2$, and $O_2$ are used as etching gas and the W film is selectively etched. At this time, second conductive layers 628b to 633b are formed by the second etching process. On the other hand, the first conductive layers 617a to 622a are hardly etched and conductive layers 628 to 633 having a second shape are formed.

Then, without removing the masks made of resist, a first doping process is performed and an impurity element imparting n-type conductivity is added to the island-shaped semiconductor films at a low concentration. The doping process may be performed through an ion doping method or an ion implantation method. Conditions for the ion doping method are as follows: a dosage is set to $1\times10^{13}$ to $5\times10^{14}$ atoms/cm$^2$ and an acceleration voltage is set to 40 to 80 kV. In this embodiment, ion doping is performed under the conditions that the dosage is $1.5\times10^{13}$ atoms/cm$^2$ and the acceleration voltage is 60 kV. As an impurity element imparting n-type conductivity, an element belonging to Group 15, typically, phosphorous (P) or arsenic (As) is used. Here, phosphorous (P) is used. In this case, the conductive layers 628 to 633 serve as masks with respect to the impurity element imparting n-type conductivity and impurity regions 623 to 627 are formed in a self-aligning manner. The impurity element imparting n-type conductivity is added to the impurity regions 623 to 627 in a concentration range of $1\times10^{18}$ to $1\times10^{20}$ atoms/cm$^3$.

After removing the masks made of resist, masks 634a to 634c made of resist are newly formed and a second doping process is performed at an acceleration voltage higher than that in the first doping process. Conditions for the ion doping method are as follows: a dosage is set to $1\times10^{13}$ to $1\times10^{15}$ atoms/cm$^2$ and an acceleration voltage is set to 60 to 120 kV. The doping process is performed such that the second conductive layers 628b to 632b are used as masks with respect to the impurity element and the impurity element is added to the island-shaped semiconductor films located below the tapered portions of the first conductive layers. Subsequently, a third doping process is performed using an acceleration voltage lower than that in the second doping process to thereby obtain a state shown in FIG. 8A. Conditions for the ion doping method are as follows: a dosage is set to $1\times10^{15}$ to $1\times10^{17}$ atoms/cm$^2$ and an acceleration voltage is set to 50 to 100 kV Through the second and the third doping processes, low concentration impurity regions 636, 642, and 648 overlapped with the first conductive layers are added with the impurity element imparting n-type conductivity in a concentration range of $1\times10^{18}$ to $5\times10^{19}$ atoms/cm$^3$ and high concentration impurity regions 635, 641, 644, and 647 are added with the impurity element imparting n-type conductivity in a concentration range of $1\times10^{19}$ to $5\times10^{21}$ atoms/cm$^3$.

Needless to say, it is also possible that the low and the high concentration impurity regions are formed through one doping process instead of performing the second and the third doping processes by setting the acceleration voltage to an appropriate value.

Subsequently, after the resist masks are removed, resist masks 650a to 650c are newly formed to perform a fourth doping process. Through this fourth doping process, in the island-shaped semiconductor films each serving as an active layer of a p-channel TFT, impurity regions 653, 654, 659, and 660 added with an impurity element imparting conductivity opposing the above conductivity are formed. Conductive layers 629a to 632a are used as masks with respect to the impurity element and an impurity element imparting p-type conductivity is added thereto to form impurity regions in a self-aligning manner. In this embodiment, the impurity regions 653, 654, 659, and 660 are formed by the ion doping method using diborane ($B_2H_6$) (FIG. 8B). At the time of this fourth doping process, the island-shaped semiconductor films each forming an n-channel TFT are covered with the masks 650a to 650c made of resist. Through the first to the third doping processes, impurity regions 639, 647, and 648 are added with phosphorous at different concentrations. However, in any region, the doping process is performed such that the impurity element imparting p-type conductivity is added thereto in a concentration range of $1\times10^{19}$ to $5\times10^{21}$ atoms/cm$^3$. Therefore, there arises no problem when the above impurity regions each serve as a source/drain region of the p-channel TFT.

Through the processes up to this point, the impurity regions are formed in the respective island-shaped semiconductor films. The masks 650a to 650c made of resist are removed, and an activation process are followed. The activation process may be performed according to the known laser activation, thermal activation, or RTA activation. Also, timing at which the laser activation process is performed may come after formation of a first interlayer insulating film.

Subsequently, a first interlayer insulating film 661 is formed. The first interlayer insulating film 661 is formed of an insulating film containing silicon with a thickness of 50 to 200 nm by using the plasma CVD method or the sputtering method. In this embodiment, the plasma CVD method is used to form a silicon oxynitride film having a thickness of 50 nm. Needless to say, the first interlayer insulating film 661 is not limited to the silicon oxynitride film but may employ a single layer or a laminate structure using the other insulating films containing silicon.

Then, heat treatment (heat treatment at 300 to 550° C. for 1 to 12 hours) is performed to thereby achieve hydrogenation. This step is a step in which hydrogen contained in the first interlayer insulating film 661 is used to terminate dangling bonds in the island-shaped semiconductor films. In this case, the island-shaped semiconductor films can be hydrogenated respective of the presence of the first interlayer insulating film. As the other means for hydrogenation, plasma hydrogenation (using hydrogen excited by plasma) may be used or heat treatment may be performed at 300 to 650° C. for 1 to 12 hours in an atmosphere containing 3 to 100% of hydrogen.

Thereafter, a second interlayer insulating film 662 made of an inorganic insulating film material or an organic insulator material is formed on the first interlayer insulating film 661. In this embodiment, an acrylic resin film having a thickness of 1.6 μm is formed. In this case, the film with a viscosity of 10 to 1000 cp, preferably, 40 to 200 cp, in which flatness are formed on the surface thereof, is used. In this case of forming a film whose surface is flat, after the pixel electrode is formed, steps using known methods such as a sand blast method or an etching method are added to make the surface flat. Thus, the mirror reflection is prevented to scatter a reflection light, so that a whiteness level is desirably increased.

In this embodiment, flatness are formed on the surface thereof, however, the second interlayer insulating film whose surface has unevennesses may be formed to thereby form unevennesses on the surface of a pixel electrode in order to prevent mirror reflection. In addition, a convex portion may be formed in a region below the pixel electrode so as to achieve a light scattering property while making the surface of the pixel electrode uneven. In this case, the convex portion can be formed using the same photomask as in the formation of the TFT, so that it can be formed without increasing the number of steps. Here, the convex portion may be appropriately formed in a pixel portion region other than wirings and TFT portions on the substrate. Thus, the unevenness formed on the surface of the pixel electrode conforms to the unevenness formed on the surface of the insulating film covering the convex portion.

Next, after the second interlayer insulating film 662 is formed, a third interlayer insulating film 672 is formed so as to be adjacent to the second interlayer insulating film 662.

Figure 9:
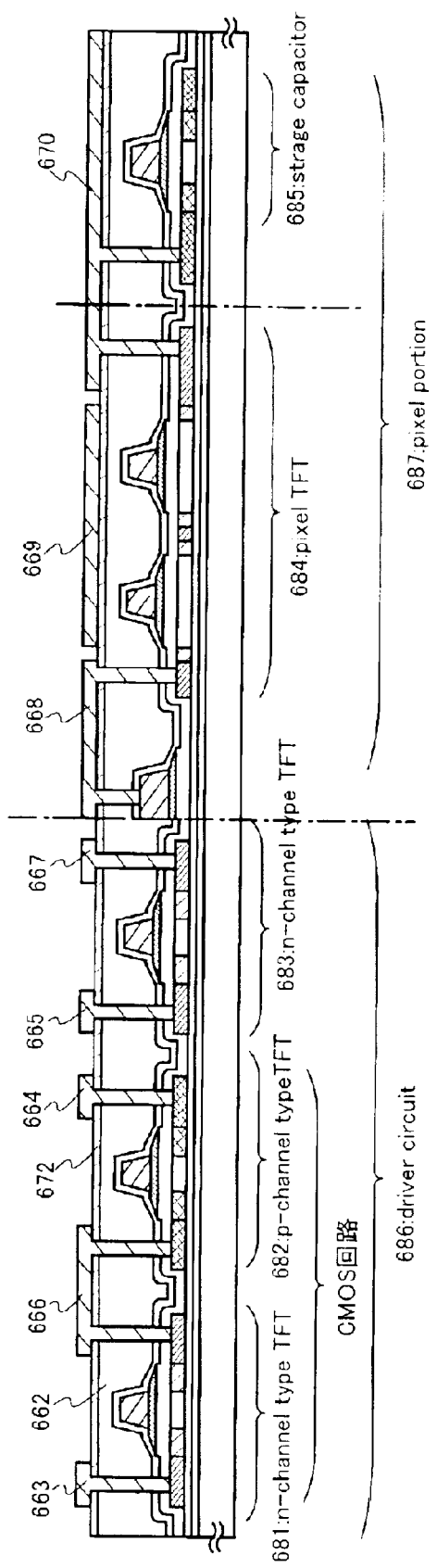
FIG. 9 shows the manufacturing method for the active matrix substrate.

Then, in a driver circuit 686, wirings 663 to 667 each electrically connected to the impurity regions are formed. Note that, the wirings are formed by patterning a laminate film consisting of a Ti film having a thickness of 50 nm and an alloy film (alloy film made of Al and Ti) having a thickness of 500 nm. Needless to say, the film is not limited to the two-layer structure but may be a single-layer structure or a laminate structure including three or more layers. Also, materials for the wirings are not limited to Al and Ti. For example, it is possible that Al or Cu is deposited on a TaN film and a Ti film is formed thereon as a laminate film, and then the laminate film is patterned to form the wirings (FIG. 9).

Also, in a pixel portion 687, a pixel electrode 670, a gate wiring 669, and a connection electrode 668 are formed. Through the connection electrode 668, a source wiring is electrically connected to a pixel TFT. The gate wiring 669 is electrically connected to a gate electrode of the pixel TFT. The pixel electrode 670 is electrically connected to a drain region of the pixel TFT and further, to the island-shaped semiconductor film 659 serving as one electrode constituting a storage capacitor. Further, it is desirable that the pixel electrode 670 is made of a film mainly containing Al or Ag, or of a material superior in reflectivity such as a laminate film thereof.

As described above, a CMOS circuit consisting of an n-channel TFT 681 and a p-channel TFT 682, the driver circuit 686 including an n-channel TFT 683, and the pixel portion 687 including a pixel TFT 684 and a capacitor storage 685 can be formed on the same substrate. Thus, the active matrix substrate is completed.

The n-channel TFT 681 of the driver circuit 686 includes a channel formation region 637, the low concentration impurity region 636 (GOLD region) overlapped with a first conductive layer 628a partially constituting the gate electrode, and a high concentration impurity region 652 serving as a source/drain region. The p-channel TFT 682 connected to the n-channel TFT 681 through an electrode 666 to constitute the CMOS circuit includes a channel formation region 640, the high concentration impurity region 653 serving as a source/drain region, and the impurity region 654 in which the impurity element imparting one of n-type conductivity and p-type conductivity is introduced. Also, the n-channel TFT 683 includes a channel formation region 643, the low concentration impurity region 642 (GOLD region) overlapped with a first conductive layer 630a partially constituting the gate electrode, and a high concentration impurity region 656 serving as a source/drain region.

The pixel TFT 684 in the pixel portion includes a channel formation region 646, a low concentration impurity region 645 (LDD region) formed outside the gate electrode, and a high concentration impurity region 658 serving as a source/drain region. The island-shaped semiconductor film serving as one electrode of the storage capacitor 685 is added with an impurity element imparting one of n-type conductivity and p-type conductivity. The storage capacitor 685 is formed of an electrode (laminate composed of the conductive layer 632a and the second conductive layer 632b) and the island-shaped semiconductor film using the insulating film 616 as dielectric.

In a pixel structure of this embodiment, in order to shield from the light a gap between the pixel electrodes without using a black matrix, the pixel electrode is arranged and formed such that an end portion thereof is overlapped with the source wiring.

Embodiment 2

This embodiment shows an embodiment in a case of including a step of crystallizing a semiconductor film using a catalyst. Here, only a point different from Embodiment 1 will be shown. When a catalytic element is used, it is desirable to employ the techniques disclosed in JP 7-130652 A and JP 8-078329 A.

After being formed, the amorphous semiconductor film is subjected to solid phase crystallization using Ni. For example, when the technique disclosed in JP 7-130652 A is used, a nickel acetate solution containing 10 ppm of nickel in terms of weight is applied onto the amorphous semiconductor film to form a layer containing nickel. After a dehydrogenation step at 500° C. for 1 hour, heat treatment at 500 to 650° C. for 4 to 12 hours, for example, heat treatment at 550° C. for 8 hours is performed to achieve crystallization. Note that, as a usable catalytic element, the following elements may be used in addition to nickel (Ni), that is, germanium (Ge), iron (Fe), palladium (Pd), tin (Sn), lead (Pb), cobalt (Co), platinum (Pt), copper (Cu), gold (Au), and the like.

Then, using the laser irradiation method of the present invention, crystallinity of the semiconductor film crystallized by NiSPC is further enhanced. The polycrystalline semiconductor film obtained by the laser light irradiation contains the catalytic element and after laser crystallization, a step of removing the catalytic element from the crystalline semiconductor film (gettering) is performed. The techniques disclosed in JP 10-135468 A and JP 10-135469 A can be used for gettering.

Specifically, phosphorous is partially added to the polycrystalline semiconductor film obtained after the laser irradiation and heat treatment is then performed in an atmosphere containing nitrogen at 550 to 800° C. for 5 to 24 hours, for example, at 600° C. for 12 hours. At this time, a region added with phosphorous in the polycrystalline semiconductor film serves as a gettering site to which phosphorous existing in the polycrystalline semiconductor film can be segregated. Thereafter, the region added with phosphorous in the polycrystalline semiconductor film is removed through patterning, so that the island-shaped semiconductor films can be obtained, in which a concentration of the catalytic element is reduced to $1 \times 10^{17}$ atoms/cm$^3$ or less, preferably, about $1 \times 10^{16}$ atoms/cm$^3$.

Embodiment 3

In this embodiment, an example of markers formed in a marker formation portion 423 will be shown. This embodiment can be implemented in combination with Embodiment 1 or 2.

Figure 12A:
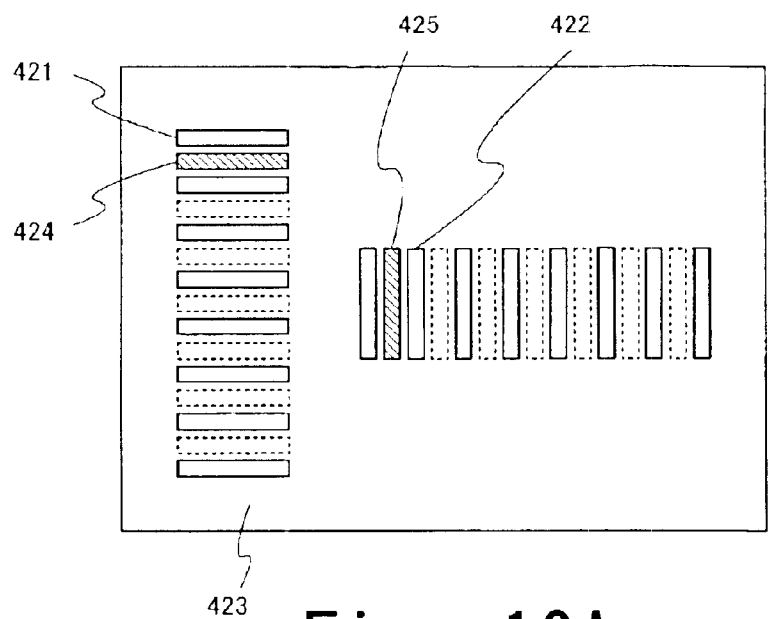
FIGS. 12A and 12B show a structure of a marker.

FIG. 12A is a top view showing the markers of this embodiment. Reference numerals 421 and 422 denote markers formed in the semiconductor film as a reference (hereinafter, referred to as reference markers), which each have a rectangular shape. The reference markers 421 are arranged such that longer sides of the rectangle are disposed in a horizontal direction in all the markers. The respective reference markers 421 are arranged in a vertical direction at a regular interval. The reference markers 422 are arranged such that longer sides of the rectangle are disposed in a vertical direction in all the markers. The respective reference markers 422 are arranged in a horizontal direction at a regular interval.

The reference markers 421 are used as a reference for positioning the masks in the vertical direction, whereas the reference markers 422 are used as a reference for positioning the masks in the horizontal direction. Denoted by 424 and 425 are markers for masks for patterning the semiconductor film, which each have a rectangular shape. Further, the markers 424 and 425 are used for positioning the masks for patterning the semiconductor film such that longer sides of the rectangle are disposed in the horizontal and the vertical directions, respectively. Then, positioning of the masks for patterning the semiconductor film is performed such that the marker 424 is placed just in a midpoint between the determined two reference markers 421 adjacent to each other and the marker 425 is placed just in a midpoint between the determined two reference markers 422 adjacent to each other.

Figure 12B:
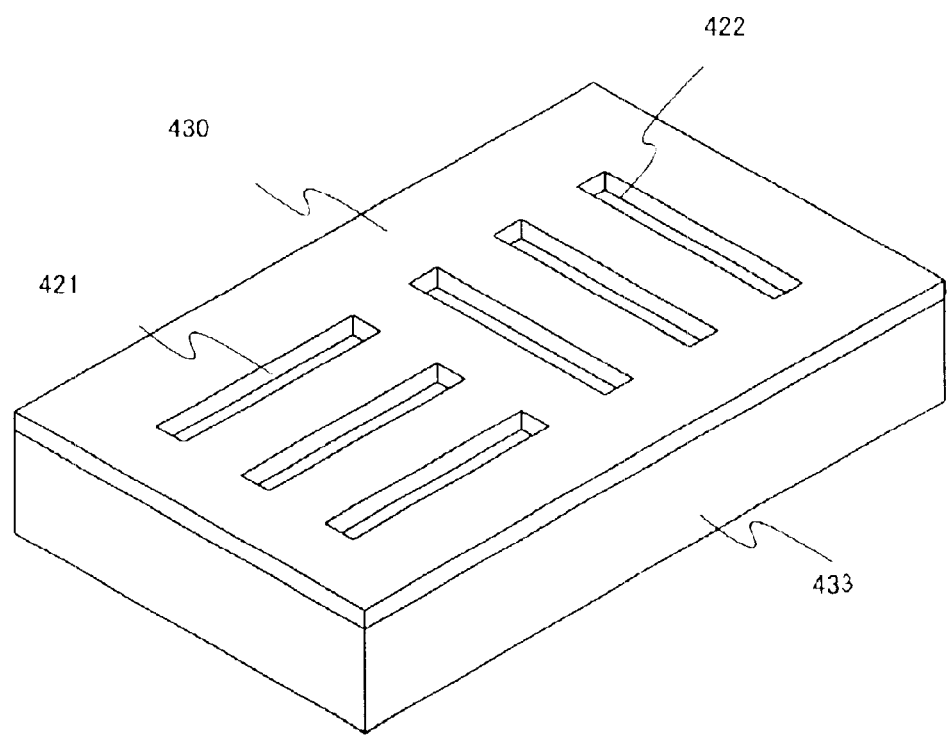

FIG. 12B is a perspective view showing the reference markers formed in the semiconductor film. A semiconductor film 430 formed on a substrate 431 is partially engraved into a rectangular shape by using a laser and the engraved portions serve as the reference markers 421 and 422.

Note that, the markers of this embodiment are shown only by way of example and the markers of the present invention are not limited to the above. The present invention can employ any marker as long as it can be formed before the semiconductor film is crystallized by the laser light and further, can be used after the crystallization by the laser light irradiation.

Embodiment 4

In this embodiment, a description will be given of an influence of a direction in which a beam spot of a laser light is scanned (laser scanning direction) with respect to a direction in which carriers in a channel formation region move (channel length direction), which is exerted on TFT characteristics using data when a semiconductor film after crystallization is used as an active layer of a TFT.

In order to determine the laser scanning direction, the markers for determining positions of the masks to the semiconductor film are formed on the semiconductor film as shown in FIGS. 5A and 5B. Here, in FIG. 5A, four marker formation portions 544 are formed at four corners, respectively, but the present invention is not limited to this structure. The positions and the number of marker formation portions are not limited to the above-mentioned form as long as the scanning portion of the laser light on the semiconductor film can be aligned in position with the mask for patterning the semiconductor film.

FIGS. 13A and 13B show the TFT characteristics in the respective cases in which the laser light is scanned to perform crystallization while the laser scanning direction is moved in directions parallel and vertical to the channel length direction. Also, mobility and a subthreshold value (S-value) calculated from the respective figures are shown in Table 1.

As shown in Table 1, the mobility and the S-value both clearly exhibit an anisotropic property. The mobility takes a higher value, which is 240.4 cm$^2$/Vs, in the case of parallel scanning as compared with a value in vertical scanning, which is 213.8 cm$^2$/Vs. The S-value takes a smaller value, which is 0.219 V/dec., in the case of parallel scanning as compared with a value in vertical scanning, which is 0.262 V/dec. From the viewpoint of semiconductor characteristics, the high mobility and the low S-value are desirable. As a result, it is preferable that the scanning direction of the laser light is parallel to the direction in which the carriers move in the channel formation region.

As also shown in FIGS. 11A and 11B, when the crystallization is performed by using the SLS method, the crystal subjected to the super lateral growth is continuously formed in a direction in which the beam spot of the laser light is scanned. At this time, the grain boundary (GB) which causes the carries to scatter appears in a direction parallel to the scanning direction of the laser light. Thus, the following is conceivable: if the carrier movement direction is vertical to the scanning direction of the laser light, the GB appears vertically to the carrier movement direction, which deteriorates the TFT characteristics.

According to the present invention, the manufacturing method for the semiconductor device can be provided, in which the crystal grains having a large grain size can be continuously formed through the artificially controlled super lateral growth and the substrate processing efficiency can be increased in the laser crystallization step, and which employs the simple laser irradiation method that requires no special optical system as in the conventional SLS method.

Further, the direction in which the carriers move in the channel formation region can be aligned with the direction in which the spot of the laser light is moved by using markers, whereby the TFT having the satisfactory characteristics can be manufactured.

What is claimed is:

1. A manufacturing method for a semiconductor device having thin film transistors comprising:
    forming an amorphous semiconductor film on an insulating surface;
    forming a marker on the amorphous semiconductor film; and
    selectively irradiating a laser light to perform crystallization to a region in which active layers of the thin film transistors are formed, based on information on arrangement of the thin film transistors with the marker used as a reference, wherein:
    the laser light is a laser light of pulse oscillation and emitted from a solid laser oscillation apparatus using semiconductor laser excitation;
    a direction in which the laser light is moved on the amorphous semiconductor film is parallel to a direction in which carriers move in channel formation regions in the thin film transistors; and
    the amorphous semiconductor film is melted over entire thickness thereof through irradiation of the laser light.

2. A manufacturing method for a semiconductor device according to claim 1, wherein the laser light is a second harmonic, a third harmonic, or a fourth harmonic.

3. A manufacturing method for a semiconductor device according to claim 1, wherein the laser light is converged onto the amorphous semiconductor film through a cylindrical lens.

4. A manufacturing method for a semiconductor device according to claim 1, wherein each time the laser light oscillates 1 pulse, a spot position of the laser light on a surface of the amorphous semiconductor film is relatively moved by a fixed distance that is 0.3 $\mu$m or more and 5 $\mu$m or less.

5. A manufacturing method for a semiconductor device according to claim 4, wherein a relative movement direction of a spot on the amorphous semiconductor film is perpendicular to a longitudinal direction of the spot.

6. A manufacturing method for a semiconductor device having thin film transistors comprising:
    forming an amorphous semiconductor film on an insulating surface;
    forming a marker on the amorphous semiconductor film;
    determining a direction in which a spot of a laser light is moved so as to be parallel to a direction in which carriers move in channel formation regions of the thin film transistors, based on information on arrangement of the thin film transistors with the marker used as a reference; and
    selectively irradiating the laser light to perform crystallization to a region in which active layers of the thin film transistors are formed, based on information on arrangement of the thin film transistors with the marker used as a reference, wherein:
    the laser light is a laser light of pulse oscillation and emitted from a solid laser oscillation apparatus using semiconductor laser excitation; and
    the amorphous semiconductor film is melted over entire thickness thereof through irradiation of the laser light.

7. A manufacturing method for a semiconductor device according to claim 6, wherein the laser light is a second harmonic, a third harmonic, or a fourth harmonic.

8. A manufacturing method for a semiconductor device according to claim 6, wherein the laser light is converged onto the amorphous semiconductor film through a cylindrical lens.

9. A manufacturing method for a semiconductor device according to claim 6, wherein each time the laser light oscillates 1 pulse, a position of the spot of the laser light on a surface of the amorphous semiconductor film is relatively moved by a fixed distance that is 0.3 $\mu$m or more and 5 $\mu$m or less.

10. A manufacturing method for a semiconductor device according to claim 9, wherein a relative movement direction of the spot of the laser light on the surface of the amorphous semiconductor film is perpendicular to a longitudinal direction of the spot.

11. A manufacturing method for a semiconductor device having thin film transistors comprising:
    forming an amorphous semiconductor film on an insulating surface;
    forming a marker on the amorphous semiconductor film; and
    selectively irradiating a laser light to perform crystallization to a region in which active layers of the thin film transistors are formed, based on information on arrangement of the thin film transistors with the marker used as a reference, wherein:
    the laser light is a laser light of pulse oscillation and emitted from a solid laser oscillation apparatus using semiconductor laser excitation; and
    a direction in which the laser light is moved on the amorphous semiconductor film is parallel to a direction in which carriers move in channel formation regions in the thin film transistors.

12. A manufacturing method for a semiconductor device according to claim 11, wherein the laser light is a second harmonic, a third harmonic, or a fourth harmonic.

13. A manufacturing method for a semiconductor device according to claim 11, wherein the laser light is converged onto the amorphous semiconductor film through a cylindrical lens.

14. A manufacturing method for a semiconductor device according to claim 11, wherein each time the laser light oscillates 1 pulse, a spot position of the laser light on a surface of the amorphous semiconductor film is relatively moved by a fixed distance that is 0.3 $\mu$m or more and 5 $\mu$m or less.

15. A manufacturing method for a semiconductor device according to claim 14, wherein a relative movement direction of a spot on the amorphous semiconductor film is perpendicular to a longitudinal direction of the spot.

16. A manufacturing method for a semiconductor device having thin film transistors comprising:
- forming an amorphous semiconductor film on an insulating surface;
- forming a marker on the amorphous semiconductor film;
- determining a direction in which a spot of a laser light is moved so as to be parallel to a direction in which carriers move in channel formation regions of the thin film transistors, based on information on arrangement of the thin film transistors with the marker used as a reference; and
- selectively irradiating the laser light to perform crystallization to a region in which active layers of the thin film transistors are formed, based on information on arrangement of the thin film transistors with the marker used as a reference,
- wherein the laser light is a laser light of pulse oscillation and emitted from a solid laser oscillation apparatus using semiconductor laser excitation.

17. A manufacturing method for a semiconductor device according to claim 16, wherein the laser light is a second harmonic, a third harmonic, or a fourth harmonic.

18. A manufacturing method for a semiconductor device according to claim 16, wherein the laser light is converged onto the amorphous semiconductor film through a cylindrical lens.

19. A manufacturing method for a semiconductor device according to claim 16, wherein each time the laser light oscillates 1 pulse, a spot position of the laser light on a surface of the amorphous semiconductor film is relatively moved by a fixed distance that is 0.3 μm or more and 5 μm or less.

20. A manufacturing method for a semiconductor device according to claim 19, wherein a relative movement direction of the spot of the laser light on the surface of the amorphous semiconductor film is perpendicular to a longitudinal direction of the spot.

21. A manufacturing method for a semiconductor device having thin film transistors comprising:
- forming an amorphous semiconductor film on an insulating surface;
- forming a marker on the amorphous semiconductor film; and
- selectively irradiating a laser light to perform crystallization to a region in which active layers of the thin film transistors are formed, based on information on arrangement of the thin film transistors with the marker used as a reference, wherein:
- the laser light is emitted from a solid laser oscillation apparatus using semiconductor laser excitation;
- a direction in which the laser light is moved on the amorphous semiconductor film is parallel to a direction in which carriers move in channel formation regions in the thin film transistors; and
- the amorphous semiconductor film is melted over entire thickness thereof through irradiation of the laser light.

22. A manufacturing method for a semiconductor device according to claim 21, wherein the laser light is a second harmonic, a third harmonic, or a fourth harmonic.

23. A manufacturing method for a semiconductor device according to claim 21, wherein the laser light is converged onto the amorphous semiconductor film through a cylindrical lens.

24. A manufacturing method for a semiconductor device according to claim 21, wherein each time the laser light oscillates 1 pulse, a spot position of the laser light on a surface of the amorphous semiconductor film is relatively moved by a fixed distance that is 0.3 μm or more and 5 μm or less.

25. A manufacturing method for a semiconductor device according to claim 24, wherein a relative movement direction of a spot on the amorphous semiconductor film is perpendicular to a longitudinal direction of the spot.

26. A manufacturing method for a semiconductor device having thin film transistors comprising:
- forming an amorphous semiconductor film on an insulating surface;
- forming a marker on the amorphous semiconductor film;
- determining a direction in which a spot of a laser light is moved so as to be parallel to a direction in which carriers move in channel formation regions of the thin film transistors, based on information on arrangement of the thin film transistors with the marker used as a reference; and
- selectively irradiating the laser light to perform crystallization to a region in which active layers of the thin film transistors are formed, based on information on arrangement of the thin film transistors with the marker used as a reference, wherein:
- the laser light is emitted from a solid laser oscillation apparatus using semiconductor laser excitation; and
- the amorphous semiconductor film is melted over entire thickness thereof through irradiation of the laser light.

27. A manufacturing method for a semiconductor device according to claim 26, wherein the laser light is a second harmonic, a third harmonic, or a fourth harmonic.

28. A manufacturing method for a semiconductor device according to claim 26, wherein the laser light is converged onto the amorphous semiconductor film through a cylindrical lens.

29. A manufacturing method for a semiconductor device according to claim 26, wherein each time the laser light oscillates 1 pulse, a position of the spot of the laser light on a surface of the amorphous semiconductor film is relatively moved by a fixed distance that is 0.3 μm or more and 5 μm or less.

30. A manufacturing method for a semiconductor device according to claim 29, wherein a relative movement direction of the spot of the laser light on the surface of the amorphous semiconductor film is perpendicular to a longitudinal direction of the spot.

* * * * *